United States Patent
Nava et al.

(10) Patent No.: US 10,109,047 B2
(45) Date of Patent: *Oct. 23, 2018

(54) DETECTING POTENTIALLY DEFECTIVE PACKAGED RADIO-FREQUENCY MODULES

(71) Applicant: SKYWORKS SOLUTIONS, INC., Woburn, MA (US)

(72) Inventors: Carlos Fabian Nava, Mexicali (MX); Viviano Almonte, Mexicali (MX)

(73) Assignee: Skyworks Solutions, Inc., Woburn, MA (US)

( * ) Notice: Subject to any disclaimer, the term of this patent is extended or adjusted under 35 U.S.C. 154(b) by 19 days.

This patent is subject to a terminal disclaimer.

(21) Appl. No.: 15/384,262

(22) Filed: Dec. 19, 2016

(65) Prior Publication Data

US 2017/0206651 A1   Jul. 20, 2017

Related U.S. Application Data

(63) Continuation of application No. 14/038,856, filed on Sep. 27, 2013, now Pat. No. 9,524,543.

(60) Provisional application No. 61/707,455, filed on Sep. 28, 2012, provisional application No. 61/707,580, filed on Sep. 28, 2012.

(51) Int. Cl.
*G06T 7/00* (2017.01)
*H05K 13/08* (2006.01)

(52) U.S. Cl.
CPC ............ *G06T 7/0006* (2013.01); *H05K 13/08* (2013.01); *G06T 7/001* (2013.01); *G06T 7/0004* (2013.01); *G06T 2207/10056* (2013.01); *G06T 2207/30141* (2013.01)

(58) Field of Classification Search
CPC ......... G06T 7/0004; G06T 2207/30148; G06T 7/001; G06T 7/0006; H05K 13/08; G01N 21/9501
USPC .......................... 382/141, 144–145, 147, 149
See application file for complete search history.

(56) References Cited

U.S. PATENT DOCUMENTS

| 2004/0012775 A1* | 1/2004 | Kinney | G01N 21/9501 356/237.2 |
| 2013/0177698 A1* | 7/2013 | Cherbis | H05K 3/22 427/8 |

\* cited by examiner

*Primary Examiner* — Ruiping Li
(74) *Attorney, Agent, or Firm* — Chang & Hale LLP

(57) ABSTRACT

Systems and methods for identifying potentially defective individual packaged modules are presented. A printed circuit board (PCB) having individual module substrates can be received. An image of the PCB is captured and a PCB recipe associated with the PCB is loaded. For each individual module substrate, a portion of the image corresponding to the individual module substrate is compared to the PCB recipe. It can be determined based on the comparison whether the individual module substrate matches the PCB recipe within a degree of tolerance. When an individual module substrate does not match the PCB recipe within the degree of tolerance, a location of the individual module substrate within a map of the PCB can be stored.

20 Claims, 22 Drawing Sheets

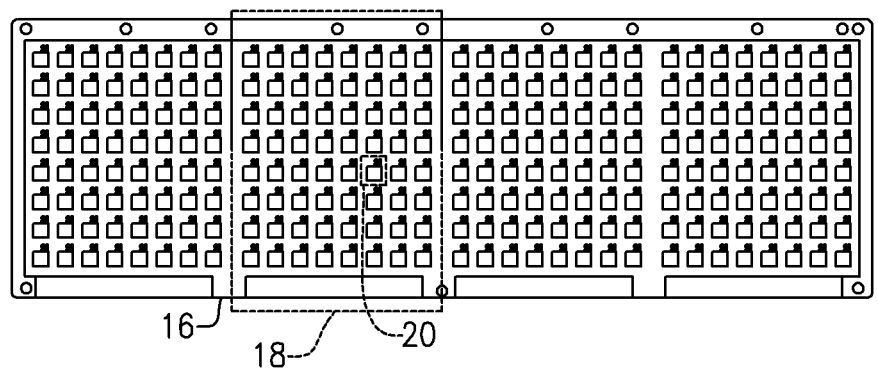
FIG.2A1
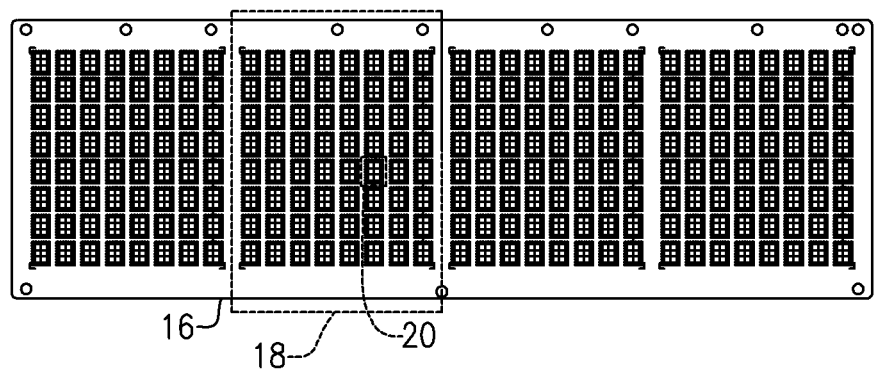
FIG.2A2

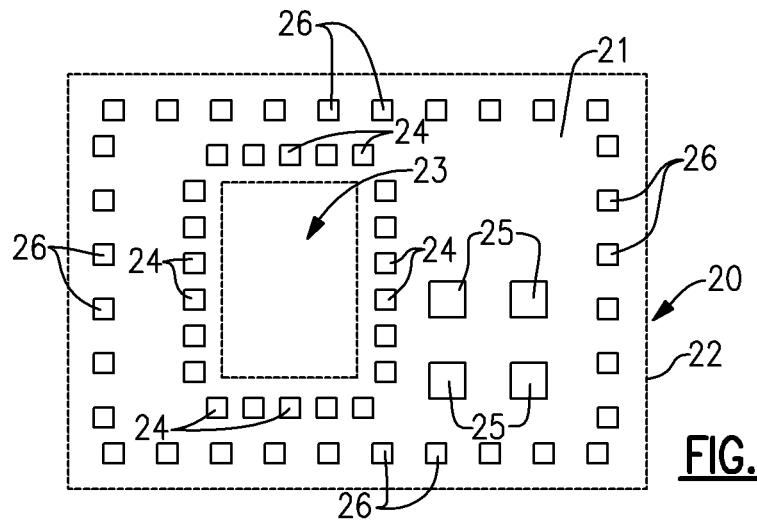
FIG.2B1
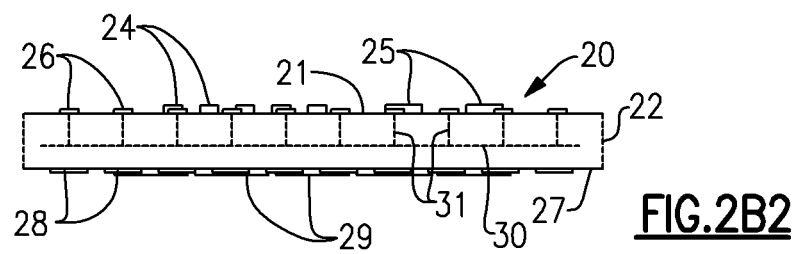
FIG.2B2
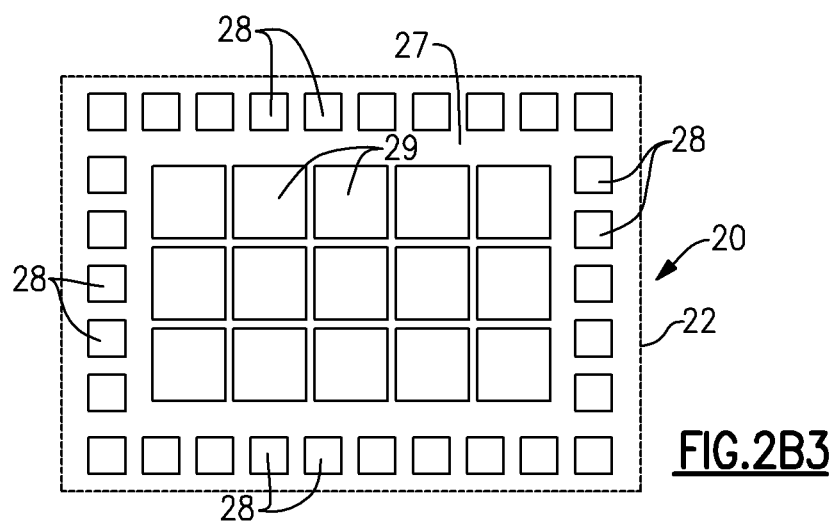
FIG.2B3

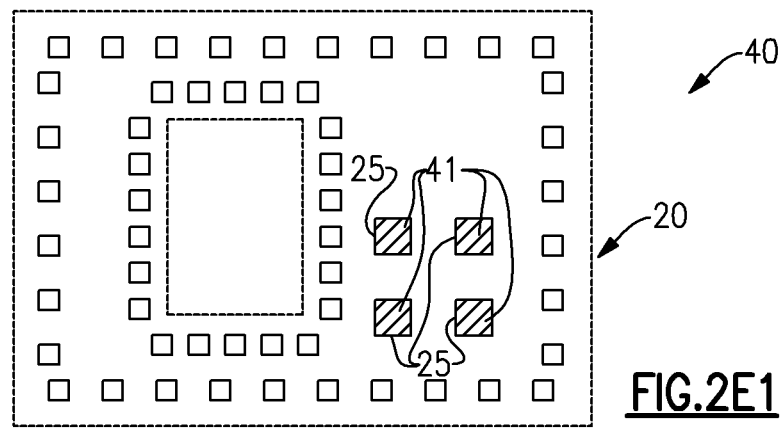
FIG.2E1
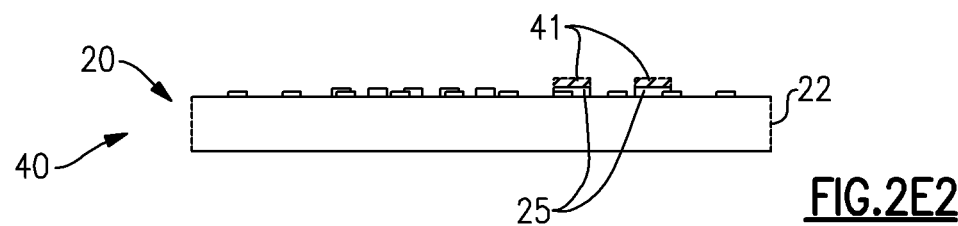
FIG.2E2
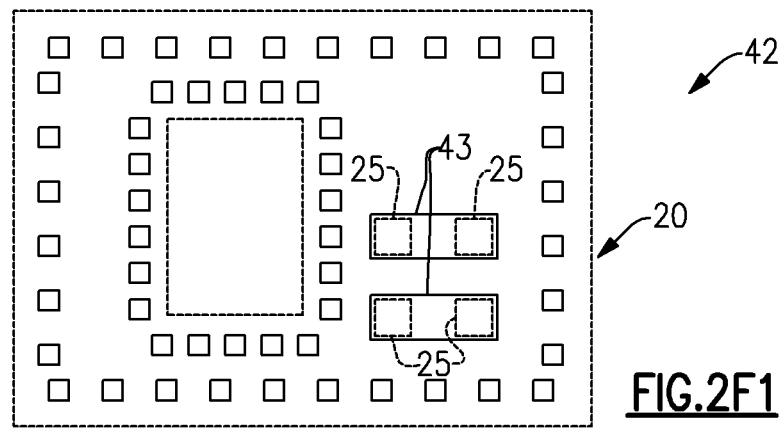
FIG.2F1
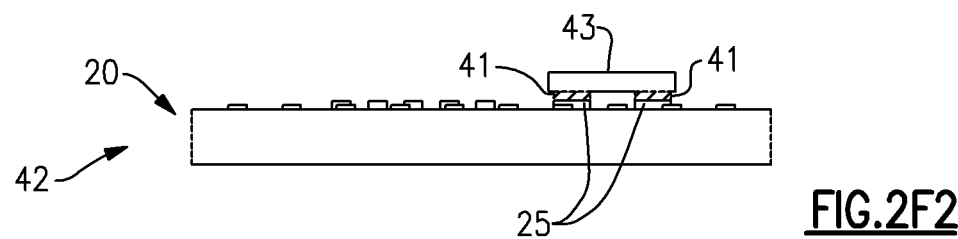
FIG.2F2

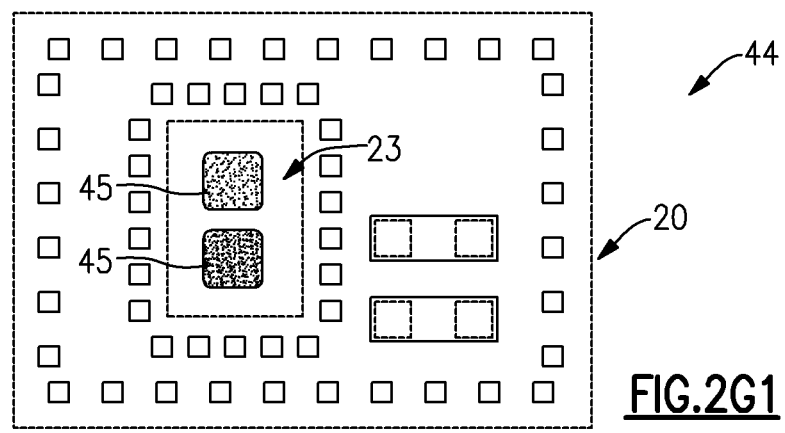
FIG.2G1
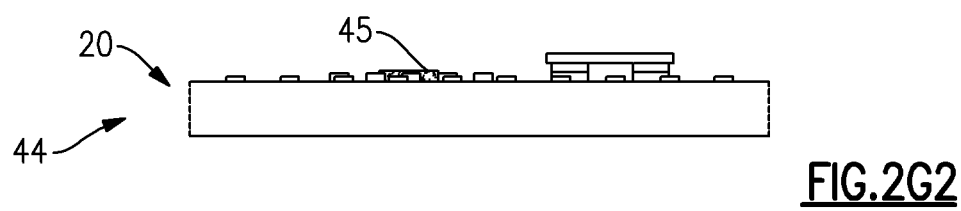
FIG.2G2
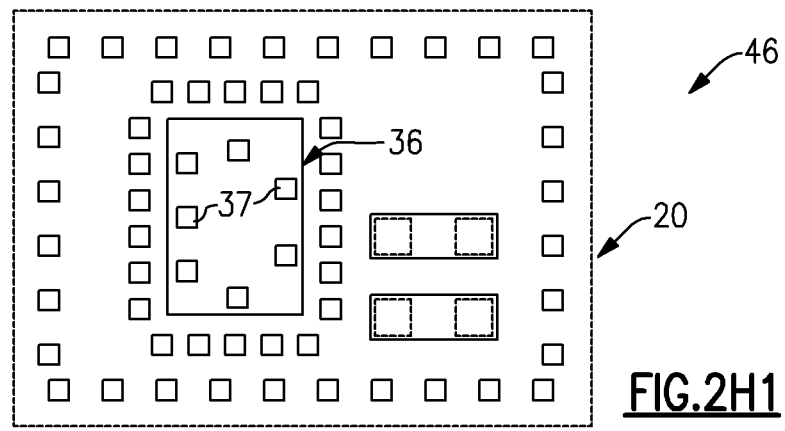
FIG.2H1
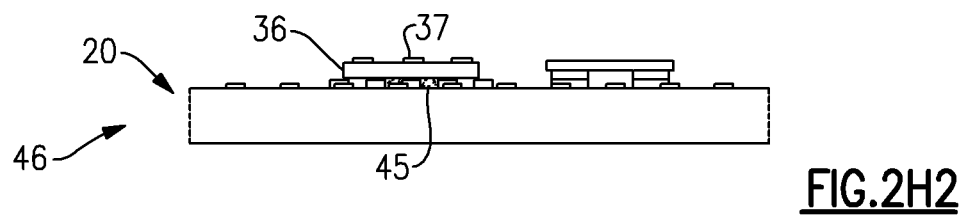
FIG.2H2

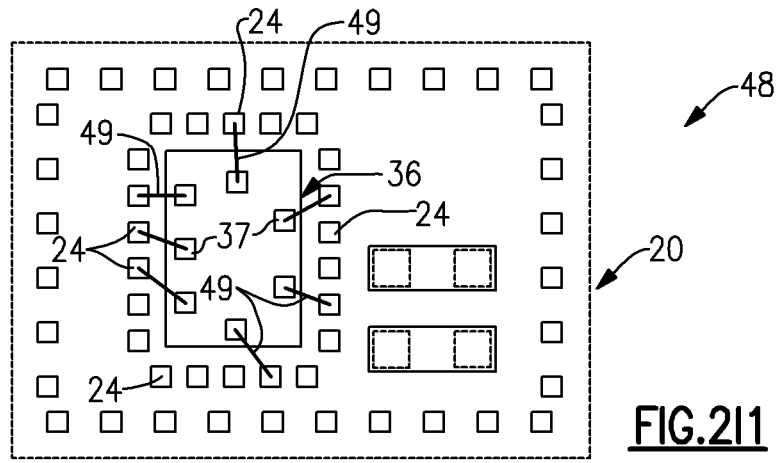
FIG. 2I1
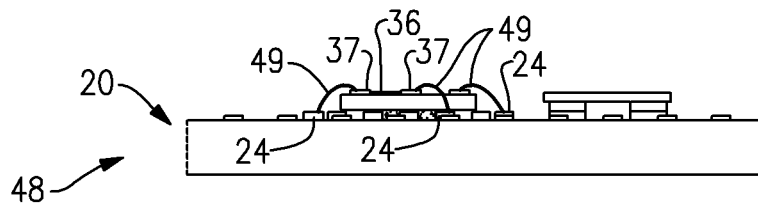
FIG. 2I2
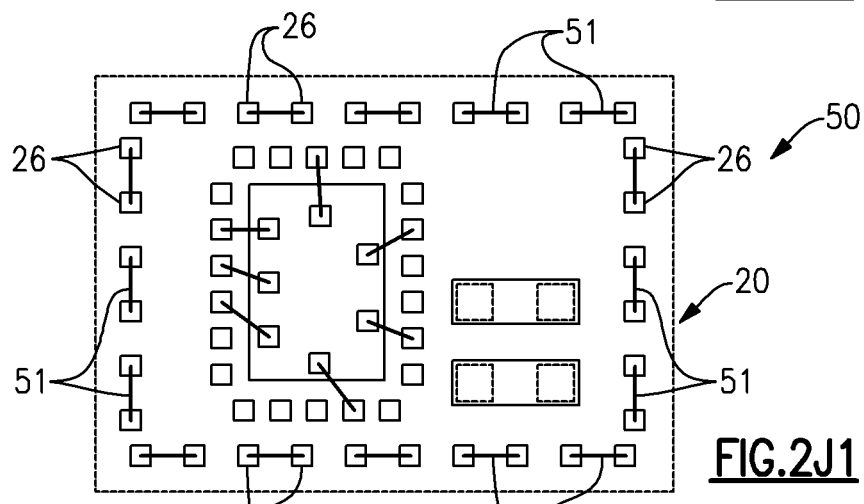
FIG. 2J1
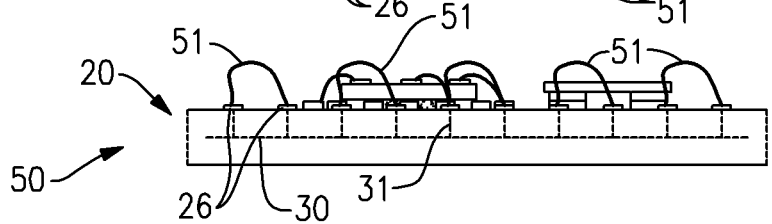
FIG. 2J2

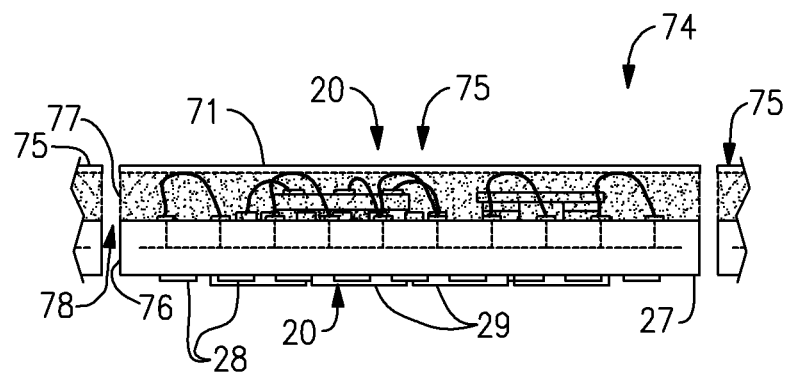
FIG.2R
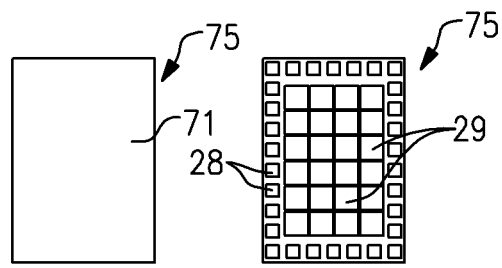
FIG.2S1   FIG.2S2
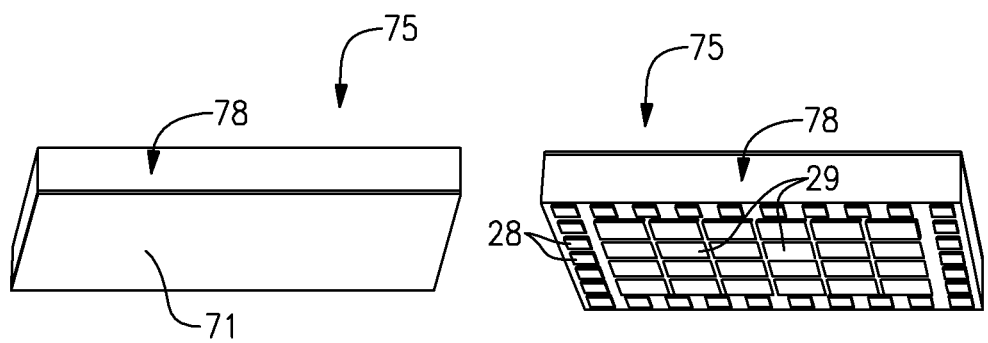
FIG.2S3

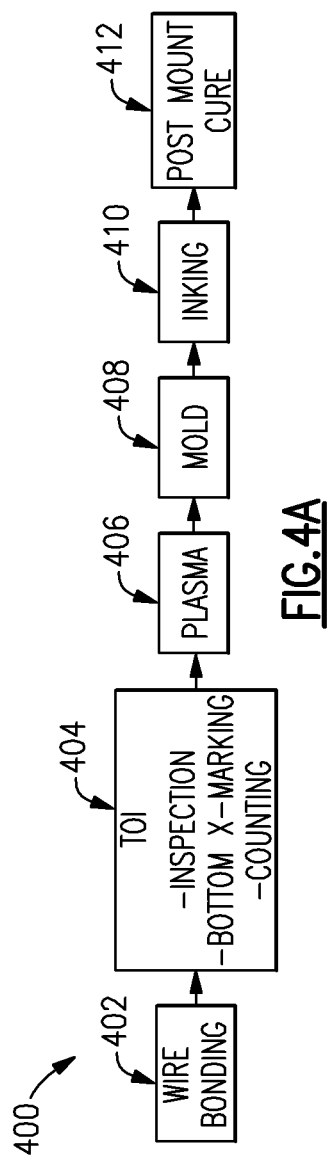
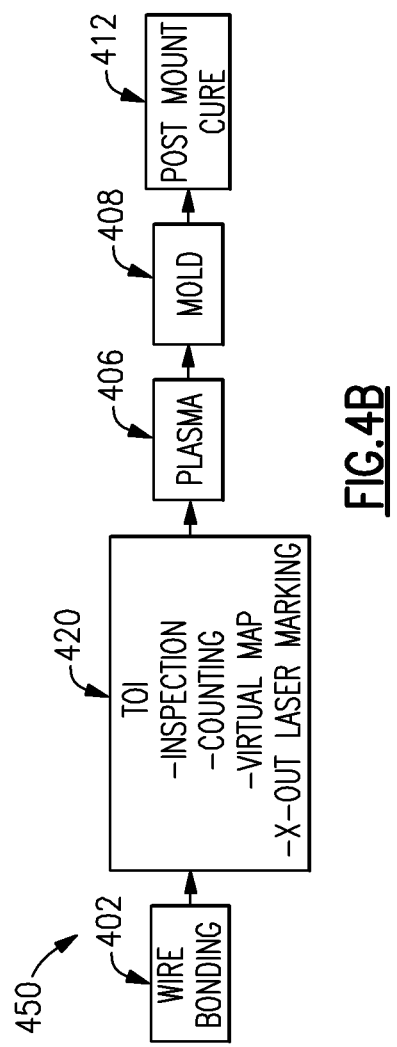

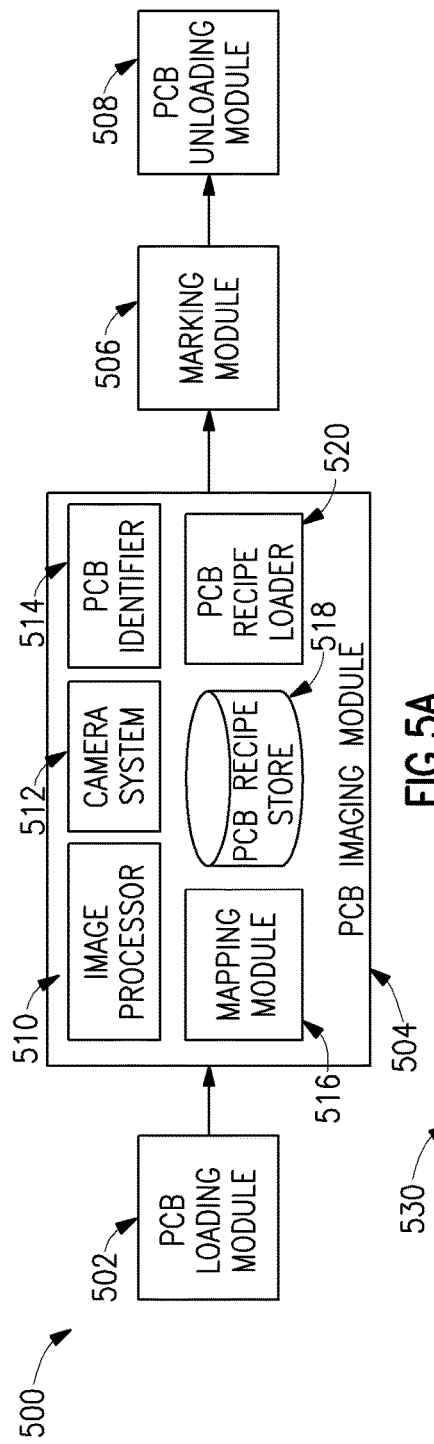
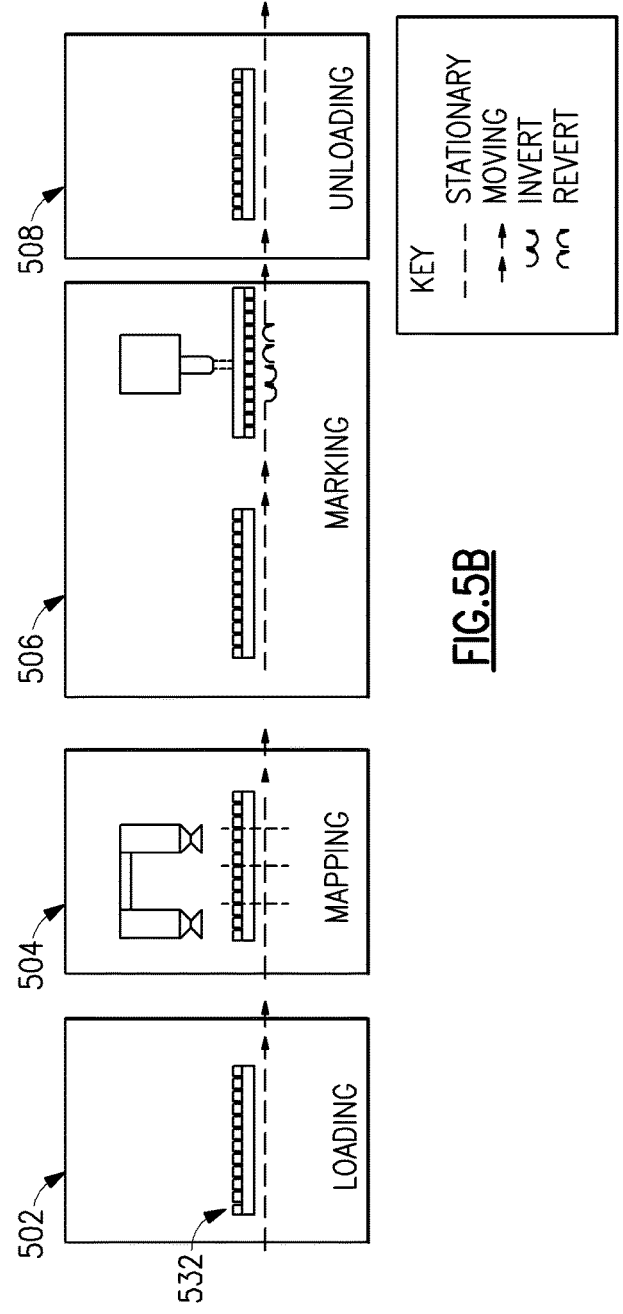
FIG.5A
FIG.5B

| PART ID | PCB ID VALIDATED | X OUT QTY | XMAP |
|---|---|---|---|
| SKY65706-31 | 62845020 | 7 | 02 08, 05 07, 06 07, 08 14, 19 12, 20 14, 47 10 |
| SKY65706-31 | 62845018 | 6 | 03 00, 03 03, 20 00, 31 09, 39 08, 44 10 |
| SKY65706-31 | 62845006 | 5 | 00 13, 04 14, 24 11, 38 11, 39 11 |
| SKY65706-31 | 62845015 | 10 | 11 08, 20 06, 20 07, 20 08, 20 14, 24 06, 25 09, 30 08, 37 07, 47 03 |
| SKY65706-31 | 62845009 | 9 | 01 04, 01 05, 08 10, 13 09, 13 10, 15 07, 42 04, 42 09, 51 06 |
| SKY65706-31 | 62845013 | 9 | 00 10, 06 07, 08 07, 11 10, 13 05, 16 03, 16 04, 23 07, 40 04 |
| SKY65706-31 | 62845008 | 7 | 09 10, 11 00, 20 13, 20 14, 23 00, 24 09, 44 01 |
| SKY65706-31 | 62845019 | 6 | 20 14, 21 02, 22 08, 23 08, 25 11, 28 14 |
| SKY65706-31 | 62845016 | 6 | 15 06, 17 10, 20 14, 22 14, 24 13, 26 12 |
| SKY65706-31 | 62845017 | 9 | 04 14, 07 04, 07 05, 12 14, 13 02, 20 14, 22 07, 41 08, 45 05 |
| SKY65706-31 | 62845011 | 5 | 06 06, 20 14, 22 09, 27 04, 29 07 |
| SKY65706-31 | 62845003 | 7 | 18 08, 27 06, 28 07, 40 13, 44 07, 46 09, 51 08 |
| SKY65706-31 | 62845004 | 7 | 02 04, 02 05, 02 06, 02 07, 05 04, 09 10, 13 07 |

FIG.7

DETECTING POTENTIALLY DEFECTIVE PACKAGED RADIO-FREQUENCY MODULES

CROSS-REFERENCE TO RELATED APPLICATIONS

This application is a continuation of U.S. patent application Ser. No. 14/038,856, filed on Sep. 27, 2013, and entitled "AUTOMATED DETECTION OF POTENTIALLY DEFECTIVE PACKAGED RADIO-FREQUENCY MODULES," which claims the benefit of priority under 35 U.S.C. § 119(e) to U.S. Provisional Application No. 61/707,455 filed Sep. 28, 2012 entitled SYSTEM AND METHOD FOR AUTOMATED DETECTION OF POTENTIALLY DEFECTIVE PACKAGED MODULES and U.S. Provisional Application No. 61/707,580 filed Sep. 28, 2012 entitled SYSTEM AND METHOD FOR AUTOMATED DETECTION OF POTENTIALLY DEFECTIVE PACKAGED MODULES, the disclosure of each of which is hereby expressly incorporated by reference herein in their respective entireties.

BACKGROUND

Field

The present disclosure relates to systems and methods for automated detection of potentially defective packaged radio-frequency modules.

Description of the Related Art

Fabricating packaged modules, such as power amplifiers, can be challenging. Many variables can lead to the production of defective modules. For instance, impurities may unintentionally be introduced during different stages of production by, for example, the fabrication environment or the operators of the fabrication and/or packaging machines. Further, scratches or other damage may occur from drops, bumps, vibrations, etc. during fabrication and/or packaging of the modules.

In addition to the monetary loss caused by the loss of revenue from defective modules, manufacturers expend resources, both monetary and personnel, to identify and remove from the production lines the defective modules. Further, interrupting production to identify and remove defective modules can reduce a manufacturer's yield leading to additional losses.

SUMMARY

For purposes of summarizing the disclosure, certain aspects, advantages and novel features of several embodiments have been described herein. It is to be understood that not necessarily all such advantages can be achieved in accordance with any particular embodiment of the embodiments disclosed herein. Thus, the embodiments disclosed herein can be embodied or carried out in a manner that achieves or optimizes one advantage or group of advantages as taught herein without necessarily achieving other advantages as can be taught or suggested herein.

In certain embodiments, a method of identifying defective individual packaged modules is implemented by one or more systems configured to detect potentially defective individual packaged modules. The method can include receiving a Printed Circuit Board (PCB), which may include a set of individual module substrates. Further, the methods can include capturing an image of the PCB and loading a PCB recipe associated with the PCB. For each individual module substrate of the set of individual module substrates, the method can further include comparing a portion of the image corresponding to the individual module substrate to the PCB recipe. In addition, the method can include determining based on the comparison whether the individual module substrate matches the PCB recipe within a degree of tolerance. In response to determining that the individual module substrate does not match the PCB recipe within the degree of tolerance, the method can further include storing a location of the individual module substrate within a map of the PCB. The map can identify individual module substrates of the PCB that are potentially defective.

Some embodiments described herein can include a system for identifying potentially defective individual packaged modules. The system can include a PCB loader configured to load a PCB, which can include a set of individual module substrates. Further, the system can include an image capture module configured to capture an image of the PCB. Moreover, the system can include a PCB recipe loader configured to load a PCB recipe corresponding to the PCB. In addition, the system can include an image processor configured, for each individual module substrate of the set of individual module substrates, to compare a portion of the image corresponding to the individual module substrate to the PCB recipe. The image processor can be further configured to determine based on the comparison whether the individual module substrate matches the PCB recipe within a degree of tolerance. Furthermore, the system can include a mapping module configured to store a location of the individual module substrate within a map of the PCB in response to the image processor determining that the individual module substrate does not match the PCB recipe within the degree of tolerance. The map can identify individual module substrates of the PCB that are potentially defective.

Various additional embodiments can include a method of identifying potentially defective individual packaged modules. The method can include receiving a PCB including a set of individual module substrates. Furthermore, the method can include capturing an image of a first face of the PCB. Additionally, the method can include determining, using the image, whether the set of individual module substrates includes potentially defective individual module substrates based on a first set of markings included on the potentially defective individual module substrates. In response to determining that the set of individual module substrates includes potentially defective individual module substrates, the method can include creating a map of the marked individual module substrates based on the first set of markings. Moreover, the method can include forming an overmold over at least a portion of the first face of the PCB. The overmold can cover the first set of markings. In addition, the method can include marking locations on the PCB corresponding to potentially defective individual module substrates to create a second set of markings. The locations can be identified via the map.

Certain embodiments can include a system for identifying potentially defective individual packaged modules. The system can include a PCB loader configured to load a PCB. The PCB can include a set of individual module substrates. The system can additionally include an image capture module configured to capture an image of a first face of the PCB. Furthermore, the system can include a processor configured to identify, using the image of the first face of the PCB, potentially defective individual module substrates of the PCB based on a first set of markings included on the potentially defective individual module substrates. Moreover, the system can include a mapping module configured to create a map of the marked individual module substrates based on the first set of markings. In addition, the system can include an overmold module configured to form an overmold over at least a portion of the first face of the PCB. The overmold can cover the first set of markings. Further, the system can include a marking module configured to mark locations on the PCB corresponding to potentially defective individual module substrates to create a second set of markings. The locations can be identified via the map.

Some embodiments described herein can include a method of identifying potentially defective individual packaged modules. The method can include receiving a PCB that includes a set of individual module substrates. Further, the method can include capturing an image of a first side of the PCB. Moreover, the method can include determining, using the image, whether the set of individual module substrates includes inked individual module substrates. The inked individual module substrates can correspond to potentially defective individual module substrates. In response to determining that the set of individual module substrates includes inked individual module substrates, the method can include creating a map of the inked individual module substrates. Further, the method can include marking with a laser locations on a second side of the PCB corresponding to inked individual module substrates. The locations can be identified via the map and the second side of the PCB can be opposite to the first side of the PCB.

Various additional embodiments described herein can include a system for identifying potentially defective individual packaged modules. The system can include a PCB loading module configured to load a PCB, which can include a set of individual module substrates. Furthermore, the system can include an image capture module configured to capture an image of a first side of the PCB. In addition, the system can include a processor configured to use the image to identify inked individual module substrates in the set of individual module substrates. The inked individual module substrates can correspond to potentially defective individual module substrates. Moreover, the system can include a mapping module configured to create a map of the inked individual module substrates. Further, the system can include a laser module configured to mark locations on the PCB corresponding to inked individual module substrates. The locations can be identified via the map.

The present disclosure relates to U.S. patent application Ser. No. 14/038,857, titled "SYSTEMS AND METHODS FOR PROCESSING PACKAGED RADIO-FREQUENCY MODULES IDENTIFIED AS BEING POTENTIALLY DEFECTIVE," filed on Sep. 27, 2013, which is hereby incorporated by reference herein in its entirety.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

FIGS. 2A1 and 2A2 show front and back sides of an example laminate panel configured to receive a plurality of dies for formation of packaged modules.

FIGS. 2B1 to 2B3 show various views of a laminate substrate of the panel configured to yield an individual module.

FIGS. 2E1 and 2E2 show various views of the laminate substrate being prepared for mounting of example surface-mount technology (SMT) devices.

FIGS. 2F1 and 2F2 show various views of the example SMT devices mounted on the laminate substrate.

FIGS. 2G1 and 2G2 show various views of the laminate substrate being prepared for mounting of an example die.

FIGS. 2H1 and 2H2 show various views of the example die mounted on the laminate substrate.

FIGS. 2I1 and 2I2 show various views of the die electrically connected to the laminate substrate by example wirebonds.

FIGS. 2J1 and 2J2 show various views of wirebonds formed on the laminate substrate and configured to facilitate electromagnetic (EM) isolation between an area defined by the wirebonds and areas outside of the wirebonds.

FIG. 2R shows individual packaged modules being cut from the panel.

FIGS. 2S1 to 2S3 show various views of an individual packaged module.

FIG. 4A illustrates an example flow of an optical inspection and inking process.

FIG. 4B illustrates an example flow of an optical inspection and laser marking process.

FIG. 5A illustrates an example of a PCB imaging and marking system.

FIG. 5B illustrates an example flow of a PCB through a PCB imaging and marking system.

FIG. 7 illustrates one example of a representation of a map identifying potentially defective individual module substrates.

DETAILED DESCRIPTION

Figure 1:
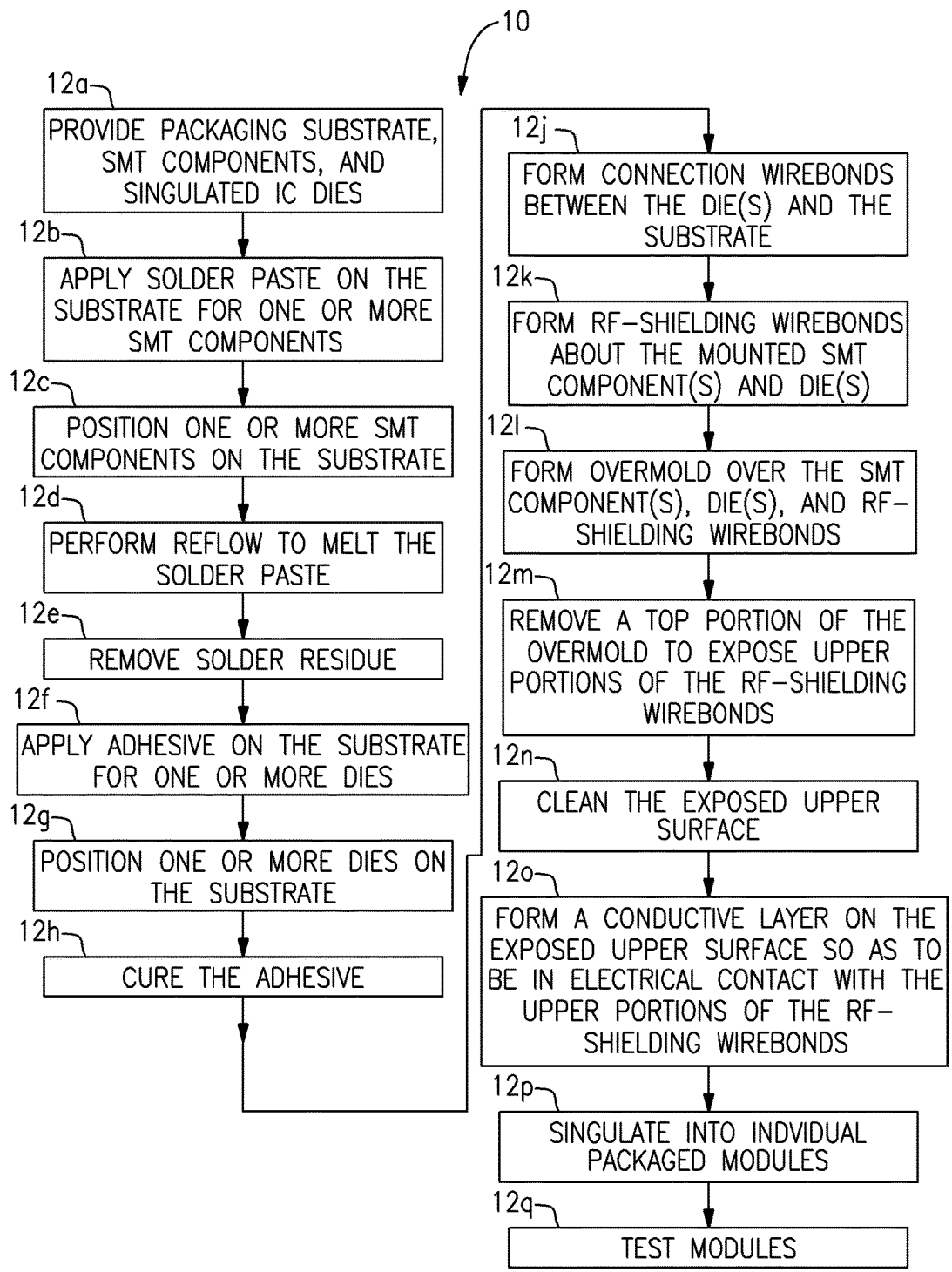
FIG. 1 shows a process that can be implemented to fabricate a packaged module that includes a die having an integrated circuit (IC).

The headings provided herein, if any, are for convenience only and do not necessarily affect the scope or meaning of the claimed invention.

Described herein are various examples of systems, apparatus, devices structures, materials and/or methods related to fabrication of packaged modules, which may include a radio-frequency (RF) circuit and wirebond-based electromagnetic (EM) isolation structures. Although described in the context of RF circuits, one or more features described herein can also be utilized in packaging applications involving non-RF components. Similarly, one or more features described herein can also be utilized in packaging applications without the EM isolation functionality.

Introduction

In some embodiments, potentially defective packaged modules can be identified by marking with ink an individual module substrate of a packaging substrate, or Printed Circuit Board (PCB), each time an event occurs that could potentially cause a packaged module to become defective during the manufacturing, fabrication, and/or packaging process of the module. These events can include anything that could potentially cause a packaged module to be defective. For example, the event can include dropping, bumping, scratching, or other physical actions. Further, vibrations, dust, and malfunctions in equipment during the fabrication and/or packaging process can lead to some packaged modules becoming defective during production. In some cases, the packaged modules may not be defective, but may be below desired specification(s). These below-specification modules may be used for different applications. However, in some cases, although the below-specification modules are not discarded, they still need to be identified and separated from the units that meet the specification(s). The inked individual module substrates are sometimes referred to as X-Outs.

In certain embodiments, the fabrication process for creating a packaged module includes forming an overmold over the dies and/or SMT components attached to the PCB. Thus, in some cases, prior to the overmolding step, an employee can use a microscope to identify individual module substrates that have been marked as potentially defective. The employee can then record the location of potentially defective individual module substrate or mark a location on the substrate (e.g., the underside) that is not covered as a result of the overmold process. By recording the location of or marking the potentially defective individual module substrate, the potentially defective packaged module can be separated from the remaining packaged modules after the fabrication process completes, or after the packaged modules are singulated, or separated. However, it can be difficult to identify the potentially defective modules because the individual module substrates are small and the markings are not easy to see. Further, employees, who could be performing other tasks, can expend significant time identifying and separating the potentially defective modules. In addition, the ink used to mark the potentially defective units may, in some cases, introduce impurities that can interfere with some types of materials used for forming a mold over the individual substrate units of the PCB.

In various embodiments, one solution to the aforementioned problems is to use one or more systems that can automatically identify potentially defective units based on the ink markings made during fabrication, comparisons to a model PCB (or PCB recipe), or a combination of the two. In some embodiments, a system can obtain images of a PCB and compare the PCB to the PCB recipe to identify the potentially defective individual module substrate of the PCB. The system can then rotate the PCB so that a side of the PCB that will not be covered during an overmold process can be marked at locations that correspond to the potentially defective individual module substrates. The system can mark the locations using an inking tool. In some embodiments, the system can include a laser system that can mark the individual module substrates. Advantageously, in certain embodiments, using the laser system to mark the potentially defective units reduces or eliminates the introduction of impurities from an ink marking that can interfere with, among other things, the overmold process.

In some embodiments, the system can including a mapping system for creating a map of the potentially defective individual module substrates. The map can be used to mark locations of the potentially defective individual module substrates that will not be covered by an overmold. In some cases, the map can be used to mark the potentially defective packaged modules after the overmold has been formed over the individual module substrates. By remarking the packaged modules, a singulator and/or sorting system can separate the potentially defective modules after the overmold has been formed. In some cases, the potentially defective units are not remarked, either before or after the overmold process. Instead, the singulator and/or sorter can identify and separate potentially defective packaged modules based on the map of the potentially defective units. Advantageously, some of the disclosed embodiments can result in improved mass production of packaged modules.

Several non-limiting examples of a fabrication process that can be used with embodiments of the present disclosure is described below. Subsequent to the fabrication process example, systems and processes for identifying potentially defective individual module substrates are described in further detail.

Example Packaged Module Fabrication Process

FIGS. 1-3 present several non-limiting examples of devices and packaged module fabrication processes that can be used with the X-Out marking systems and processes described herein. The X-Out marking systems and processes described herein can be used with other fabrication processes and are not limited for use in conjunction with the examples presented in FIGS. 1-3.

FIG. 1 shows a process 10 that can be implemented to fabricate a packaged module having and/or via one or more features as described herein. FIG. 2 shows various parts and/or stages of various steps associated with the process 10 of FIG. 1.

In block 12a of FIG. 1, a packaging substrate and parts to be mounted on the packaging substrate can be provided. Such parts can include, for example, one or more surface-mount technology (SMT) components and one or more singulated dies having integrated circuits (ICs). FIGS. 2A1 and 2A2 show that in some embodiments, the packaging substrate can include a laminate panel 16. FIG. 2A1 shows the example panel's front side; and FIG. 2A2 shows the panel's back side. The panel 16 can include a plurality of individual module substrates 20 arranged in groups that are sometimes referred to as cookies 18.

FIGS. 2B1-2B3 show front, side and back, respectively, of an example configuration of the individual module substrate 20. For the purpose of description herein, a boundary 22 can define an area occupied by the module substrate 20 on the panel 16. Within the boundary 22, the module substrate 20 can include a front surface 21 and a back surface 27. Shown on the front surface 21 is an example mounting area 23 dimensioned to receive a die (not shown). A plurality of example contact pads 24 are arranged about the die-receiving area 23 so as to allow formation of connection wirebonds between the die and contact pads 28 arranged on the back surface 27. Although not shown, electrical connections between the wirebond contact pads 24 and the module's contact pads 28 can be configured in a number of ways. Also within the boundary 22 are two sets of example contact pads 25 configured to allow mounting of, for example passive SMT devices (not shown). The contact pads can be electrically connected to some of the module's contact pads and/or ground contact pads 29 disposed on the back surface 27. Also within the boundary 22 are a plurality of wirebond pads 26 configured to allow formation of a plurality of EM-isolating wirebonds (not shown). The wirebond pads 26 can be electrically connected to an electrical reference plane (such as a ground plane) 30. Such connections between the wirebond pads 26 and the ground plane 30 (depicted as dotted lines 31) can be achieved in a number of ways. In some embodiments, the ground plane 30 may or may not be connected to the ground contact pads 29 disposed on the back surface 27.

Figure 2C:
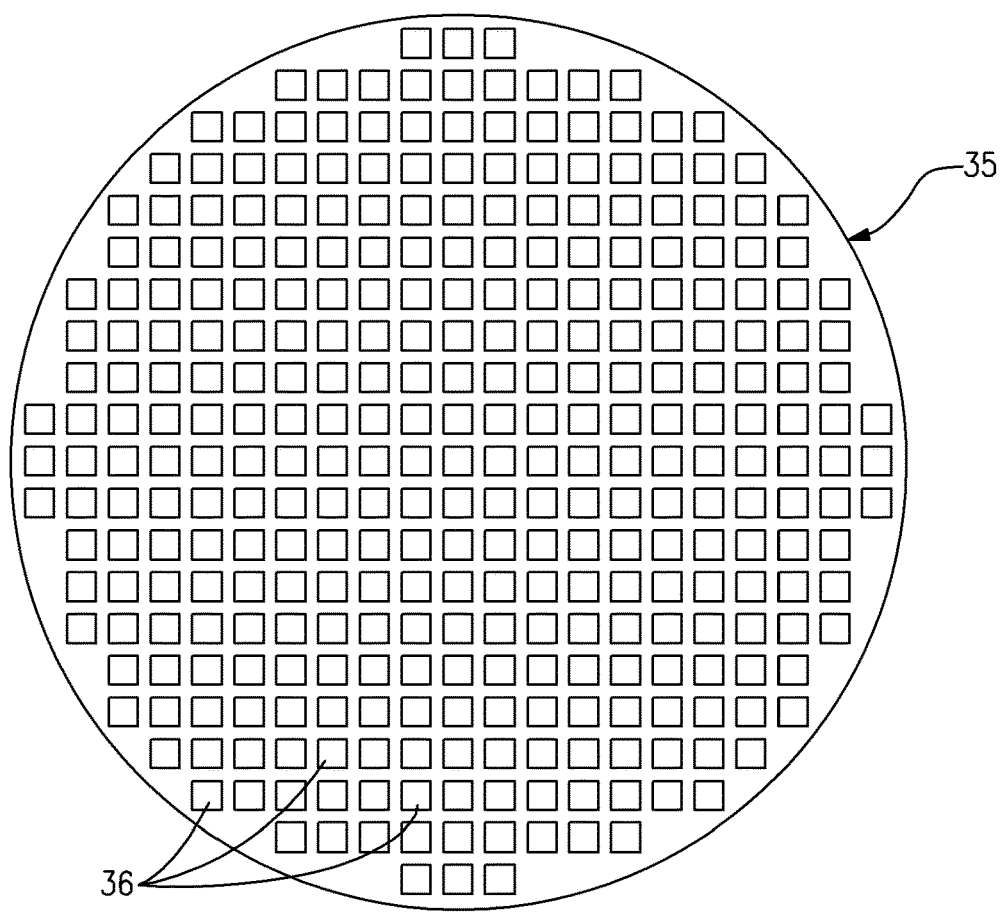
FIG. 2C shows an example of a fabricated semiconductor wafer having a plurality of dies that can be singulated for mounting on the laminate substrate.
Figure 2D:
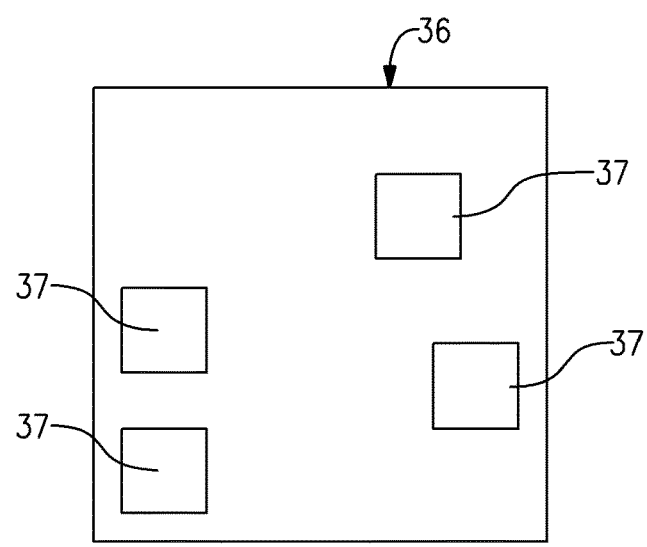
FIG. 2D depicts an individual die showing example electrical contact pads for facilitating connectivity when mounted on the laminate substrate.

FIG. 2C shows an example fabricated wafer 35 that includes a plurality of functional dies 36 awaiting to be cut (or sometimes referred to as singulated) into individual dies. Such cutting of the dies 36 can be achieved in a number of ways. FIG. 2D schematically depicts an individual die 36 where a plurality of metallized contact pads 37 can be provided. Such contact pads can be configured to allow formation of connection wirebonds between the die 36 and the contact pads 24 of the module substrate (e.g., FIG. 2B1).

In block 12*b* of FIG. 1, solder paste can be applied on the module substrate to allow mounting of one or more SMT devices. FIGS. 2E1 and 2E2 show an example configuration 40 where solder paste 41 is provided on each of the contact pads 25 on the front surface of the module substrate 20. In some implementations, the solder paste 41 can be applied to desired locations on the panel (e.g., 16 in FIG. 2A1) in desired amount by an SMT stencil printer.

In block 12*c* of FIG. 1, one or more SMT devices can be positioned on the solder contacts having solder paste. FIGS. 2F1 and 2F2 show an example configuration 42 where example SMT devices 43 are positioned on the solder paste 41 provided on each of the contact pads 25. In some implementations, the SMT devices 43 can be positioned on desired locations on the panel by an automated machine that is fed with SMT devices from tape reels.

In block 12*d* of FIG. 1, a reflow operation can be performed to melt the solder paste to solder the one or more SMT devices on their respective contact pads. In some implementations, the solder paste 41 can be selected and the reflow operation can be performed to melt the solder paste 41 at a first temperature to thereby allow formation of desired solder contacts between the contact pads 25 and the SMT devices 43.

In block 12*e* of FIG. 1, solder residue from the reflow operation of block 12*d* can be removed. By way of an example, the substrates can be run through a solvent or aqueous cleaning step. Such a cleaning step can be achieved by, for example, a nozzle spray, vapor chamber, or full immersion in liquid.

In block 12*f* of FIG. 1, adhesive can be applied on one or more selected areas on the module substrate 20 to allow mounting of one or more dies. FIGS. 2G1 and 2G2 show an example configuration 44 where adhesive 45 is applied in the die-mounting area 23. In some implementations, the adhesive 45 can be applied to desired locations on the panel (e.g., 16 in FIG. 2A1) in desired amount by techniques such as screen printing.

In block 12*g* of FIG. 1, one or more dies can be positioned on the selected areas with adhesive applied thereon. FIGS. 2H1 and 2H2 show an example configuration 46 where an example die 36 is positioned on the die-mounting area 23 via the adhesive 45. In some implementations, the die 36 can be positioned on the die-mounting area on the panel by an automated machine that is fed with dies from a tape reel.

In block 12*h* of FIG. 1, the adhesive between the die the die-mounting area can be cured. Preferably, such a curing operation can be performed at one or more temperatures that are lower than the above-described reflow operation for mounting of the one or more SMT devices on their respective contact pads. Such a configuration allows the solder connections of the SMT devices to remain intact during the curing operation.

In block 12*j* of FIG. 1, electrical connections such as wirebonds can be formed between the mounted die(s) and corresponding contact pads on the module substrate 20. FIGS. 2I1 and 2I2 show an example configuration 48 where a number of wirebonds 49 are formed between the contact pads 37 of the die 36 and the contact pads 24 of the module substrate 20. Such wirebonds can provide electrical connections for signals and/or power to and from one or more circuits of the die 36. In some implementations, the formation of the foregoing wirebonds can be achieved by an automated wirebonding machine.

In block 12*k* of FIG. 1, a plurality of RF-shielding wirebonds can be formed about a selected area on the module substrate 20. FIGS. 2J1 and 2J2 show an example configuration 50 where a plurality of RF-shielding wirebonds 51 are formed on wirebond pads 26. The wirebond pads 26 are schematically depicted as being electrically connected (dotted lines 31) with one or more reference planes such as a ground plane 30. In some embodiments, such a ground plane can be disposed within the module substrate 20. The foregoing electrical connections between the RF-shielding wirebonds 51 and the ground plane 30 can yield an interconnected RF-shielding structure at sides and underside of the area defined by the RF-shielding wirebonds 51. As described herein, a conductive layer can be formed above such an area and connected to upper portions of the RF-shielding wirebonds 51 to thereby form an RF-shielded volume.

In the example configuration 50, the RF-shielding wirebonds 51 are shown to form a perimeter around the area where the die (36) and the SMT devices (43) are located. Other perimeter configurations are also possible. For example, a perimeter can be formed with RF-wirebonds around the die, around one or more of the SMT devices, or any combination thereof. In some implementations, an RFwirebond-based perimeter can be formed around any circuit, device, component or area where RF-isolation is desired. For the purpose of description, it will be understood that RF-isolation can include keeping RF signals or noise from entering or leaving a given shielded area.

In the example configuration 50, the RF-shielding wirebonds 51 are shown to have an asymmetrical side profile configured to facilitate controlled deformation during a molding process as described herein. Additional details concerning such wirebonds can be found in, for example, PCT Publication No. WO 2010/014103 titled "SEMICONDUCTOR PACKAGE WITH INTEGRATED INTERFERENCE SHIELDING AND METHOD OF MANUFACTURE THEREOF." In some embodiments, other shaped RF-shielding wirebonds can also be utilized. For example, generally symmetric arch-shaped wirebonds as described in U.S. Pat. No. 8,071,431, titled "OVERMOLDED SEMICONDUCTOR PACKAGE WITH A WIREBOND CAGE FOR EMI SHIELDING," can be used as RF-shielding wirebonds in place of or in combination with the shown asymmetric wirebonds. In some embodiments, RF-shielding wirebonds do not necessarily need to form a loop shape and have both ends on the surface of the module substrate. For example, wire extensions with one end on the surface of the module substrate and the other end positioned above the surface (for connecting to an upper conductive layer) can also be utilized.

In the example configuration 50 of FIGS. 2J1 and 2J2, the RF-shielding wirebonds 51 are shown to have similar heights that are generally higher than heights of the die-connecting wirebonds (49). Such a configuration allows the die-connecting wirebonds (49) to be encapsulated by molding compound as described herein, and be isolated from an upper conductive layer to be formed after the molding process.

Figure 2K:
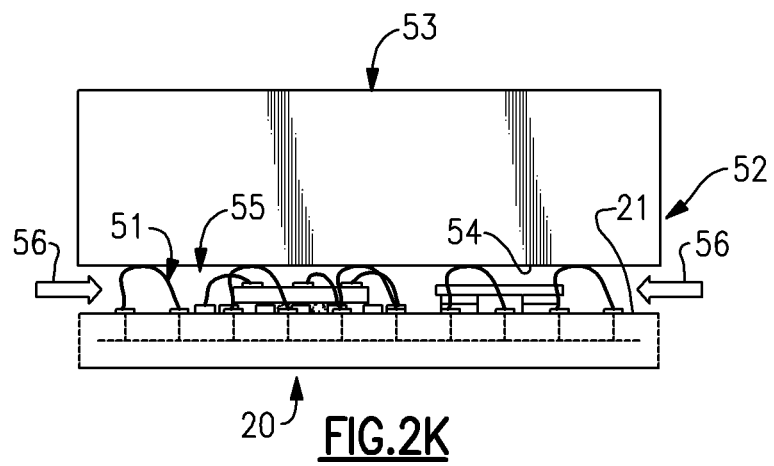
FIG. 2K shows a side view of molding configuration for introducing molding compound to a region above the laminate substrate.

In block 12l of FIG. 1, an overmold can be formed over the SMT component(s), die(s), and RF-shielding wirebonds. FIG. 2K shows an example configuration 52 that can facilitate formation of such an overmold. A mold cap 53 is shown to be positioned above the module substrate 20 so that the lower surface 54 of the mold cap 53 and the upper surface 21 of the module substrate 20 define a volume 55 where molding compound can be introduced.

In some implementations, the mold cap 53 can be positioned so that its lower surface 54 engages and pushes down on the upper portions of the RF-shielding wirebonds 51. Such a configuration allows whatever height variations in the RF-shielding wirebonds 51 to be removed so that the upper portions touching the lower surface 54 of the mold cap 53 are at substantially the same height. When the mold compound is introduced and an overmold structure is formed, the foregoing technique maintains the upper portions of the encapsulated RF-shielding wirebonds 51 at or close to the resulting upper surface of the overmold structure.

In the example molding configuration 52 of FIG. 2K, molding compound can be introduced from one or more sides of the molding volume 55 as indicated by arrows 56. In some implementations, such an introduction of molding compound can be performed under heated and vacuum condition to facilitate easier flow of the heated molding compound into the volume 55.

Figure 2L:
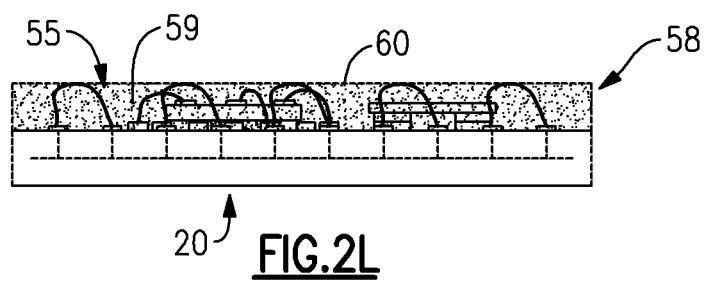
FIG. 2L shows a side view of an overmold formed via the molding configuration of FIG. 2K.

FIG. 2L shows an example configuration 58 where molding compound has been introduced into the volume 55 as described in reference to FIG. 2K and the molding cap removed to yield an overmold structure 59 that encapsulates the various parts (e.g., die, die-connecting wirebonds, and SMT devices). The RF-shielding wirebonds are also shown to be substantially encapsulated by the overmold structure 59. The upper portions of the RF-shielding wirebonds are shown to be at or close to the upper surface 60 of the overmold structure 59.

Figure 2M:
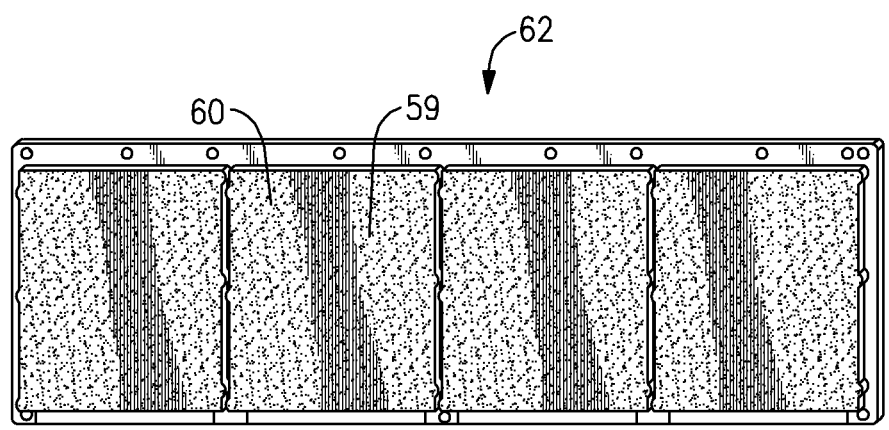
FIG. 2M shows the front side of a panel with the overmold.

FIG. 2M shows an example panel 62 that has overmold structures 59 formed over the multiple cookie sections. Each cookie section's overmold structure can be formed as described herein in reference to FIGS. 2K and 2L. The resulting overmold structure 59 is shown to define a common upper surface 60 that covers the multiple modules of a given cookie section.

The molding process described herein in reference to FIGS. 2K-2M can yield a configuration where upper portions of the encapsulated RF-shielding wirebonds are at or close to the upper surface of the overmold structure. Such a configuration may or may not result in the RF-shielding wirebonds forming a reliable electrical connection with an upper conductor layer to be formed thereon.

Figure 2N:
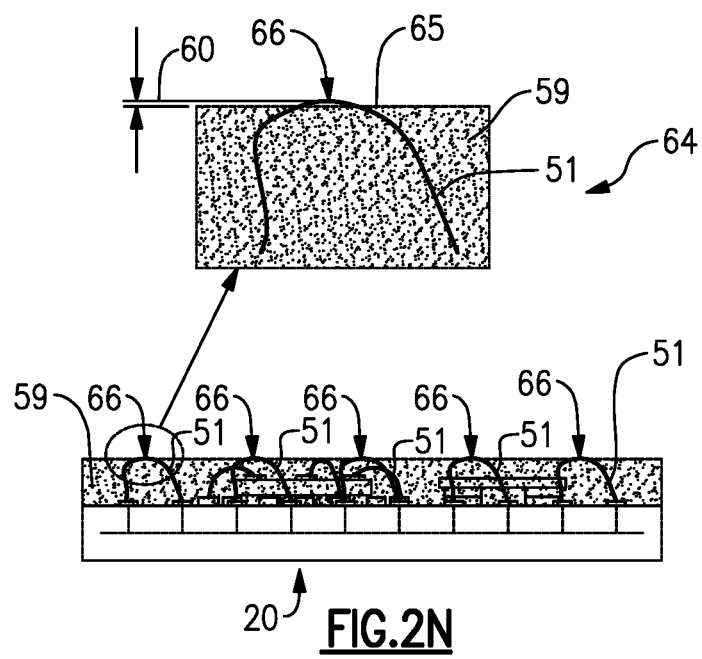
FIG. 2N shows a side view of how an upper portion of the overmold can be removed to expose upper portions of the EM isolation wirebonds.

In block 12m of FIG. 1, a top portion of the overmold structure can be removed to better expose upper portions of the RF-shielding wirebonds. FIG. 2N shows an example configuration 64 where such a removal has been performed. In the example, the upper portion of the overmold structure 59 is shown to be removed to yield a new upper surface 65 that is lower than the original upper surface 60 (from the molding process). Such a removal of material is shown to better expose the upper portions 66 of the RF-shielding wirebonds 51.

Figure 2O:
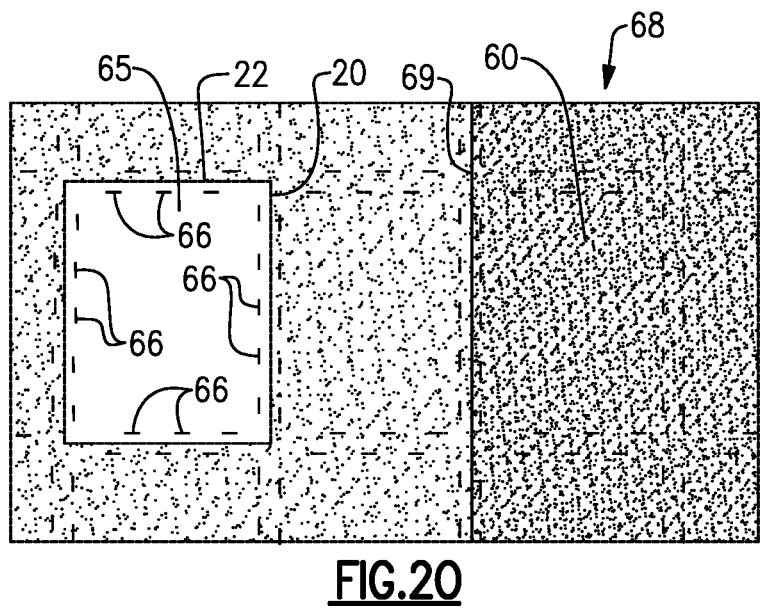
FIG. 2O shows a photograph of a portion of a panel where a portion of the overmold has its upper portion removed to better expose the upper portions of the EM isolation wirebonds.

The foregoing removal of material from the upper portion of the overmold structure 59 can be achieved in a number of ways. FIG. 2O shows an example configuration 68 where such removal of material is achieved by sand-blasting. In the example, the lighter-shaded portion is where material has been removed to yield the new upper surface 65 and better exposed upper portions 66 of the RF-shielding wirebonds. The darker-shaded portion is where material has not been removed, so that the original upper surface 60 still remains. The region indicated as 69 is where the material-removal is being performed. The region without shading is to facilitate illustrating the upper portions 66 and is generally equivalent to the lighter-shaded portion with respect to the removal of the material.

In the example shown in FIG. 2O, a modular structure corresponding to the underlying module substrate 20 (depicted with a dotted box 22) is readily shown. Such modules will be separated after a conductive layer is formed over the newly formed upper surface 65.

In block 12n of FIG. 1, the new exposed upper surface resulting from the removal of material can be cleaned. By way of an example, the substrates can be run through a solvent or aqueous cleaning step. Such a cleaning step can be achieved by, for example, a nozzle spray, or full immersion in liquid.

In block 12o of FIG. 1, an electrically conductive layer can be formed on the new exposed upper surface of the overmold structure, so that the conductive layer is in electrical contact with the upper portions of the RF-shielding wirebonds. Such a conductive layer can be formed by a number of different techniques, including methods such as spraying or printing.

Figure 2P:
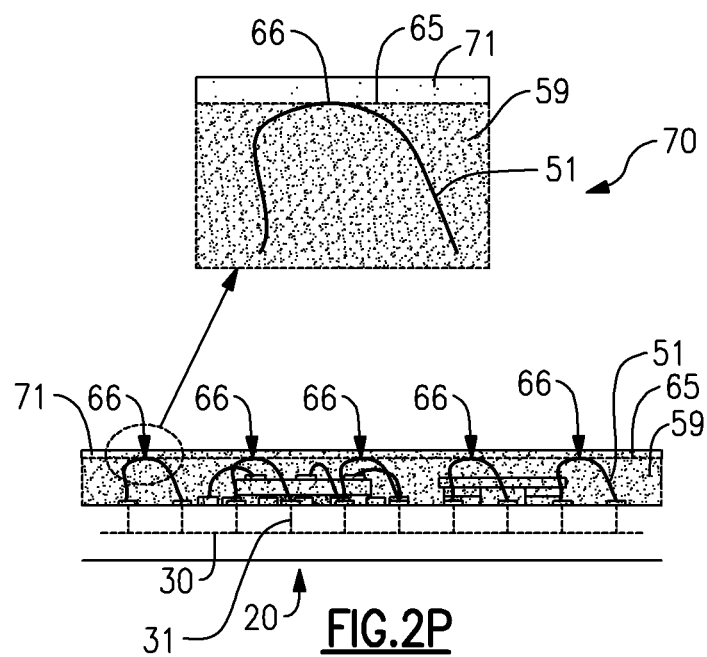
FIG. 2P shows a side view of a conductive layer formed over the overmold such that the conductive layer is in electrical contact with the exposed upper portions of the EM isolation wirebonds.

FIG. 2P shows an example configuration 70 where an electrically conductive layer 71 has been formed over the upper surface 65 of the overmold structure 59. As described herein, the upper surface 65 better exposes the upper portions 66 of the RF-shielding wirebonds 51. Accordingly, the formed conductive layer 71 forms improved contacts with the upper portions 66 of the RF-shielding wirebonds 51.

As described in reference to FIG. 2J, the RF-shielding wirebonds 51 and the ground plane 30 can yield an interconnected RF-shielding structure at sides and underside of the area defined by the RF-shielding wirebonds 51. With the upper conductive layer 71 in electrical contact with the RF-shielding wirebonds 51, the upper side above the area is now shielded as well, thereby yielding a shielded volume.

Figure 2Q:
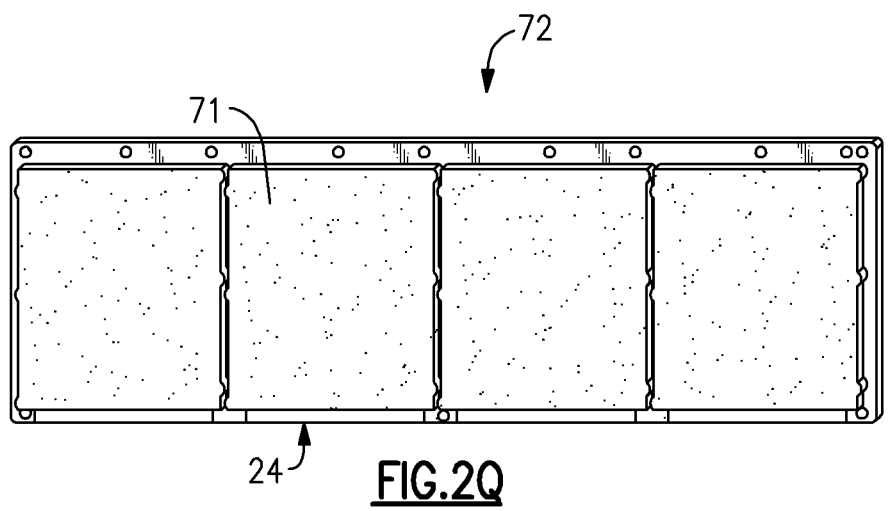
FIG. 2Q shows a photograph of a panel where the conductive layer can be a spray-on metallic paint.

FIG. 2Q shows an example panel 72 that has been sprayed with conductive paint to yield an electrically conductive layer 71 that covers multiple cookie sections. As described in reference to FIG. 2M, each cookie section includes multiple modules that will be separated.

In block 12p of FIG. 1, the modules in a cookie section having a common conductive layer (e.g., a conductive paint layer) can be singulated into individual packaged modules. Such singulation of modules can be achieved in a number of ways, including a sawing technique.

FIG. 2R shows an example configuration 74 where the modular section 20 described herein has been singulated into a separated module 75. The overmold portion is shown to include a side wall 77; and the module substrate portion is shown to include a side wall 76. Collectively, the side walls 77 and 76 are shown to define a side wall 78 of the separated module 75. The upper portion of the separated module 75 remains covered by the conductive layer 71. As described herein in reference to FIG. 2B, the lower surface 27 of the separated module 75 includes contact pads 28, 29 to facilitate electrical connections between the module 75 and a circuit board such as a phone board.

FIGS. 2S1, 2S2 and 2S3 show front (also referred to as top herein), back (also referred to as bottom herein) and perspective views of the singulated module 75. As described herein, such a module includes RF-shielding structures encapsulated within the overmold structure; and in some implementations, the overall dimensions of the module 75 is not necessarily any larger than a module without the RF-shielding functionality. Accordingly, modules having integrated RF-shielding functionality can advantageously yield a more compact assembled circuit board since external RF-shield structures are not needed. Further, the packaged modular form allows the modules to be handled easier during manipulation and assembly processes.

In block 12q of FIG. 1, the singulated modules can be tested for proper functionality. As discussed above, the modular form allows such testing to be performed more easily. Further, the module's internal RF-shielding functionality allows such testing to be performed without external RF-shielding devices.

Figure 2T:
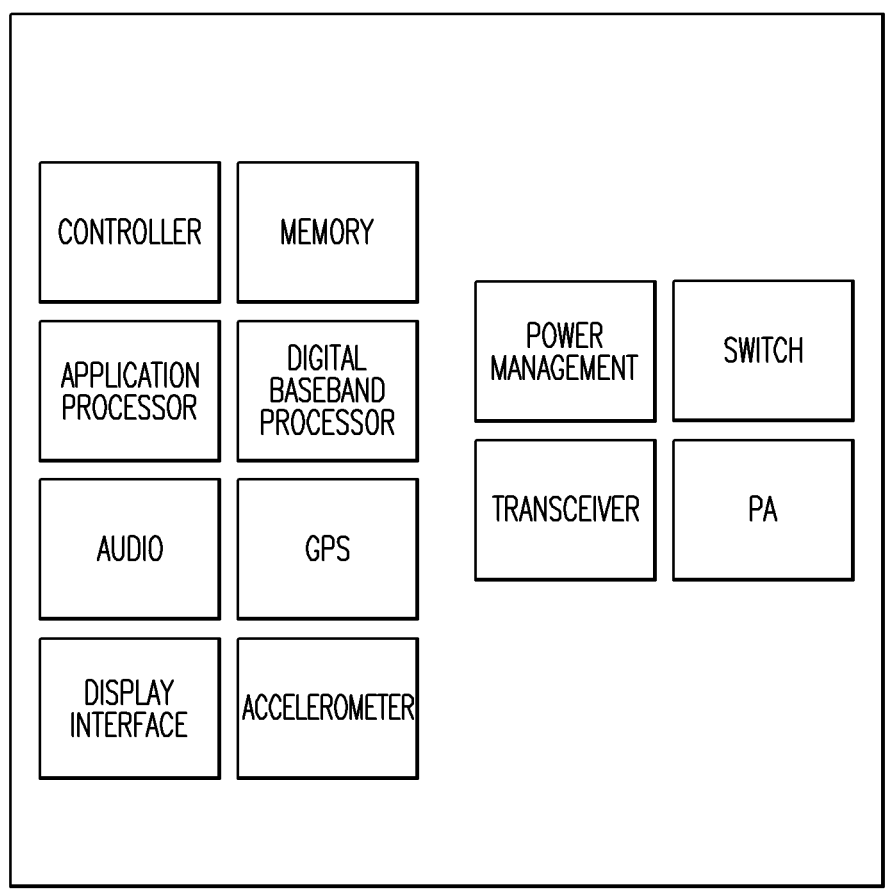
FIG. 2T shows that one or more of modules that are mounted on a wireless phone board can include one or more features as described herein.

FIG. 2T shows that in some embodiments, one or more modules included in a circuit board such as a wireless phone board can be configured with one or more packaging features as described herein. Non-limiting examples of modules that can benefit from such packaging features include, but are not limited to, a controller module, an application processor module, an audio module, a display interface module, a memory module, a digital baseband processor module, GPS module, an accelerometer module, a power management module, a transceiver module, a switching module, and a power amplifier module.

Figure 3A:
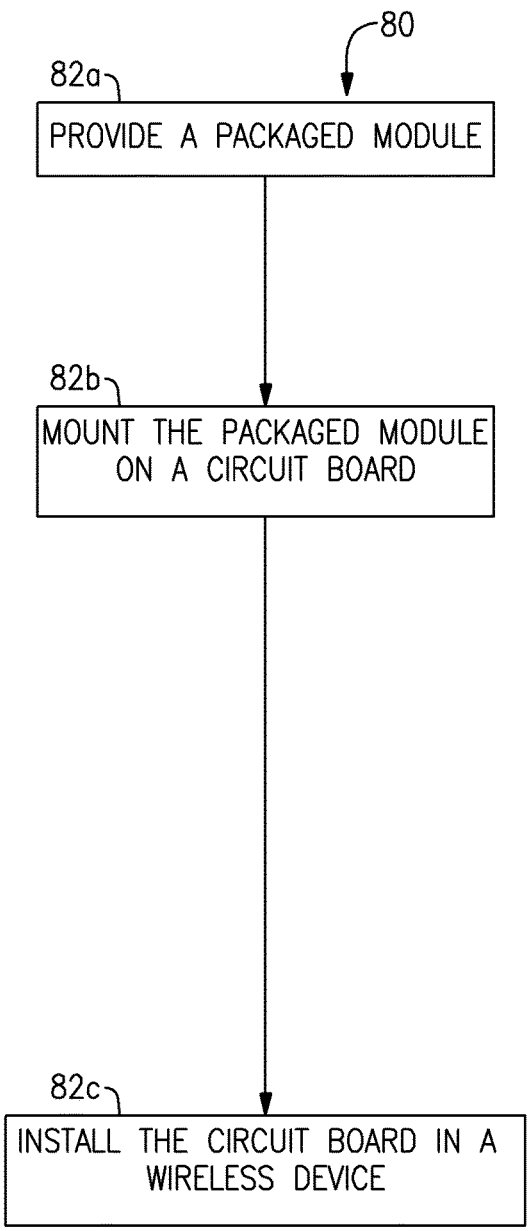
FIG. 3A shows a process that can be implemented to install a packaged module having one or more features as described herein on a circuit board such as the phone board of FIG. 2T.
Figure 3B:
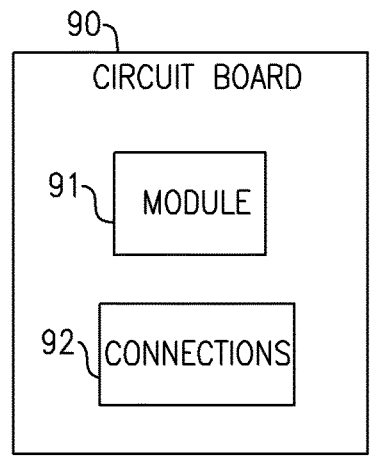
FIG. 3B schematically depicts the circuit board with the packaged module installed thereon.

FIG. 3A shows a process 80 that can be implemented to assemble a packaged module having one or more features as described herein on a circuit board. In block 82a, a packaged module can be provided. In some embodiments, the packaged module can represent a module described in reference to FIG. 2T. In block 82b, the packaged module can be mounted on a circuit board (e.g., a phone board). FIG. 3B schematically depicts a resulting circuit board 90 having module 91 mounted thereon. The circuit board can also include other features such as a plurality of connections 92 to facilitate operations of various modules mounted thereon.

Figure 3C:
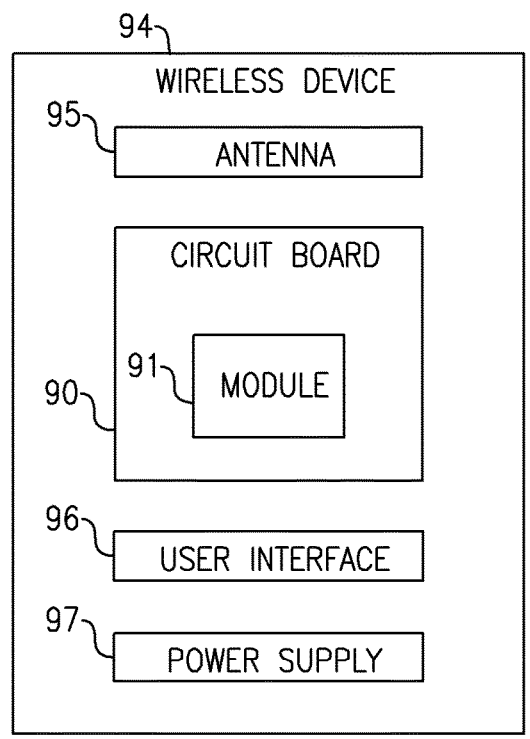
FIG. 3C schematically depicts a wireless device having the circuit board with the packaged module installed thereon.

In block 82c, a circuit board having modules mounted thereon can be installed in a wireless device. FIG. 3C schematically depicts a wireless device 94 (e.g., a cellular phone) having a circuit board 90 (e.g., a phone board). The circuit board 90 is shown to include a module 91 having one or more features as described herein. The wireless device is shown to further include other components, such as an antenna 95, a user interface 96, and a power supply 97.

As described herein in reference to block 12o of the example process 10 of FIG. 1 and the configurations 70 (FIG. 2P), 72 (FIG. 2O) and 74 (FIG. 2R), a conductive layer 71 can be formed to provide RF shielding functionality. More particularly, such a conductive layer in electrical contact with RF-shielding wirebonds 51 which in turn are in contact with a ground plane can form an RF-shielded volume. As described herein, such a conductive layer can include a conductive paint layer.

Example Flow of an Optical Inspection and Marking Process

FIG. 4A illustrates an example flow of an optical inspection and inking process 400. The process 400 may be performed as part of a number of fabrication processes including as part of a packaged module fabrication process. Further, the process 400 may be performed by a number of systems used in the fabrication processes including by systems used in performing a packaged module fabrication process.

The process 400 begins with a wire bonding machine creating wire bonds on a packaging substrate or PCB. In certain embodiments, a number of additional processes may be performed prior to the wire bonding 402 and/or instead of the wire bonding 402. Further, additional processes may, in certain instances, be performed after the wire bonding 402, but before the process 400 proceeds to the Thorough Optical Inspection (TOI) 404 operation.

After completing the wire bonding 402, the process 400 continues on to the TOI 404 operation. The TOI 404 operation can include a number of processes. These processes can include inspecting the PCB to identify X-Outs, or inked individual module substrates that are potentially defective, marking the bottom of individual module substrates that are potentially defective, and counting the number of potentially defective individual module substrates. The TOI 404 operation may be performed by one or more systems, such as a PCB imaging module as will be described in more detail below with respect to FIG. 5A.

After completing the TOI 404 operation, the process 400 performs a plasma operation 406. The plasma operation 406 removes impurities and contaminants from the surfaces of the PCB using energetic plasma. In certain instances, this cleaning operation removes ink markings from the PCB. In some embodiments, Additional processes, including other cleaning operations, may, in some cases, supplement or substitute for the plasma operation 406. Moreover, in some cases, the plasma operation 406 is optional.

The process 400 forms a mold over at least a portion of the PCB as part of a molding operation 408. The molding operation 408 can include forming an overmold over components attached directly or indirectly to the PCB. For example, as described above with respect to the block 121, the overmold can be formed over SMT component(s), die(s), and RF-shielding wirebonds that are attached directly or indirectly to the PCB.

A marking module performs an inking process as part of the inking operation 410. The marking module is described in more detail with respect to FIG. 5A. The inking operation 410 may be used to ink individual module substrates that were identified as potentially defective during the TOI 404 operation.

A post mount cure operation 412 may be performed as part of the process 400. This post mount cure operation 412 can be used to help set or solidify the mold on the PCB. Although shown as subsequent to the inking operation 410, in some cases the post mount cure operation 412 may occur prior to the inking operation 410.

As previously mentioned, in some cases the plasma operation 406 may remove ink markings on the X-Outs. Further, in some cases, the molding 408 operation can cause the markings of the X-Outs to be covered. Advantageously, in certain embodiments, the inking operation 410 enables the X-Outs to be identified after a cleaning (e.g., plasma operation 406) and/or molding operation is performed.

In some cases, the inking operation 410 may interfere with or introduce unwanted impurities into a packaged module fabrication process. FIG. 4B illustrates an alternative optical inspection and marking process 450 that includes a laser marking operation. Advantageously, in certain embodiments, the process 450 reduces the occurrence of the introduction of impurities into the packaged module fabrication process.

As with the process 400, the process 450 can include one or more operations prior to a TOI operation. For example, as illustrated in FIG. 4B, the process 450 can include wire bonding 402. Further, as with the TOI 404 operation of the process 400, the TOI 420 operation of the process 450 can include an inspection and counting operation to identify and count the number of potentially defective individual module substrates. In addition, the TOI 404 operation can include creating a virtual map of the PCB that identifies the potentially defective individual module substrates of the PCB. Moreover, the TOI 404 operation can include marking the bottom of X-Out modules, or potentially defective individual module substrates, using a laser.

As with the process 400, the process 450 can also include the plasma operation 406, the molding operation 408 and the post mount cure operation 412. However, in certain embodiments, the process 450 may exclude the inking operation 410. Excluding the inking operation 410 may be possible in certain cases because the laser marking of the bottom of the X-Outs during the TOI 420 operation eliminates the need for additional inking.

Example of a PCB Imaging and Marking System

FIG. 5A illustrates an example of a PCB imaging and marking system 500. The PCB imaging and marking system 500 may be included as part of a system for performing a packaged module fabrication process, such as a fabrication process for fabricating individual packaged modules.

As illustrated in FIG. 5A, the PCB imaging and marking system 500 may include a number of subsystems including a PCB loading module 502 (or PCB loader), a PCB imaging module 504, a marking module 506, and a PCB unloading module 508 (or PCB unloader). In some cases, the PCB imaging and marking system 500 may include additional or fewer subsystems than depicted in FIG. 5A. For example, in embodiments where the PCB imaging and marking system 500 is configured to automatically receive PCBs from a preceding fabrication module, such as a wire bonding machine or cleansing machine, the PCB loading module 502 may be optional or may be integrated into the PCB imaging module 504. As a second example, the PCB imaging and marking system 500 may include a cleansing machine, e.g., a PCB plasma cleaner, prior to the marking module 506 in the system flow illustrated in FIG. 5A.

The PCB loading module 502 can include any system that can load a PCB into the PCB imaging and marking system 500. In some cases, the PCB loading module 502 can receive a set of PCBs, such as in a magazine, and provide or feed the PCBs one at a time into the PCB imaging module 504. In other cases, the PCB loading module 502 may receive a PCB from a user or from another system that includes a feed, such as a conveyor belt, between the system and the PCB loading module 502. For example, a wirebonding machine may be configured to pass a PCB to the PCB loading machine 502, which may then pass the PCB to the PCB imaging module 504 for further processing.

The PCB imaging module 504 may include any system configured to identify X-Outs, or potentially defective units or individual module substrates on the PCB. The PCB imaging module 504 can include an image processor 510, a camera system 512, a PCB identifier 514, a mapping module 516, a PCB recipe store 518, and a PCB recipe loader 520.

The image processor 510 can include one or more processors configured to process images obtained by the camera system 512. Further, the image processor 510 can compare one or more images to a PCB recipe loaded by the PCB recipe loader 520. Processing the images can include filtering, cropping, equalizing, performing optical character recognition, binarizing or performing any other operation that can facilitate the image processor 510 comparing the images to the PCB recipe. In some cases, comparing the images to the PCB recipe can involve performing pattern matching to identify differences between the images and the PCB recipe.

Generally, the PCB recipe includes an image of the PCB without defective individual module substrates. In some cases, the PCB recipe may be an ideal image of the PCB. In certain embodiments, the PCB recipe is a mathematical abstraction or representation of the PCB as identified in a manufacturing specification of the PCB. In such embodiments, the image processor 510 may convert the image obtained from the camera system 512 to a mathematical abstraction or representation of the captured image and compare the mathematical abstraction or representation to that of the PCB recipe to identify potentially defective individual module substrates in the PCB.

The camera system 512 can include any type and number of imaging devices that can be used to obtain or capture an image of a PCB provided to the PCB imaging module 504. For example, the camera system 512 may include digital cameras, optical cameras, thermal cameras, infrared cameras, etc. Further, the camera system 512 may include one, two, three, four, or more cameras. In some cases, the number of cameras may be dependent on the type of PCB or the organization of individual module substrates on the PCB. For example, as previously described with respect to FIGS. 2A1 and 2A2, a PCB may include a number of individual module substrates 20 arranged in groups or cookies 18. If the PCB includes four cookies, the camera system 512 may be configured with two or four cameras. In some instances, the camera system 512 may include more cameras than cookies. In such cases, less than all of the cameras of the camera system 512 may be active. For example, if the camera system 512 includes four cameras, but the PCB includes two cookies, two of the four cameras may be activated by the camera system 512.

In some cases, the PCB imaging module 504 may be configured to process PCBs of a specific type, model, or configuration of attached components (e.g., devices, dies, or SMT components). In such cases, the PCB imaging module 504 may have a PCB recipe loaded or specified by a user. However, in other cases, the PCB imaging module 504 may be configured to process a number of different types or models of PCBs, or PCBs with different device configurations. The PCB identifier loader 520 can be configured to load a PCB recipe based on the PCB type, model or configuration. In certain cases, the PCB identifier 514 can identify the PCB type, model, or configuration by analyzing the PCB and/or an image of the PCB obtained by the camera system 512.

Alternatively, or in addition, the PCB identifier 514 can determine the PCB type, model, or configuration by accessing a PCB identification panel, such as the PCB identification panel 800, which is described in more detail below with respect to FIG. 8. To access the PCB identification panel, the PCB identifier 514 may include a scanner, such as an optical scanner, that is capable of accessing a machine-readable code included on the PCB identification panel. The machine-readable code can be any type of code that can include information used to identify a PCB model or type, such as a linear bar code, QR code, ShotCodes, Data Matrix codes, etc. In some cases, the PCB identifier 514 can determine a configuration of attached components for the PCB based on a configuration associated with the PCB type or model stored in the PCB recipe store 518.

In some embodiments, based on the PCB mode or type identified by the PCB identifier 514, the PCB recipe loader 520 can load a PCB recipe from the PCB recipe store 518. In other cases, the PCB recipe loader 520 may access a server or data repository over a network (e.g., the Internet) to access the PCB recipe.

The mapping module 516 can create a map of the PCB. This map can include information identifying X-Outs, inked individual module substrates, or potentially defective individual module substrates. For example, the map may include location coordinates for each X-Out on the PCB. One example of a mapping of X-Outs is described in further detail below with respect to FIG. 7. In some cases, the map may include an image of the PCB with symbols or markings to show the location of X-Outs or inked modules.

Once the PCB imaging module 504 identified the inked individual module substrates, or X-Outs, the marking module 506 can mark the bottom or underside of the PCB at locations corresponding to the locations of the identified X-Outs. The marking module 506 can include any system that can position the underside of the PCB to face a marking instrument, such as an inking mechanism or a laser. Further, the marking module 506 can include any system that can mark the PCB at locations identified by the PCB imaging module 504.

The PCB unloading module 508 that can unload a PCB from the PCB imaging and marking system 500. Further, the PCB unloading module 508 can include any system that can provide a subsequent system used in a fabrication process with access to the PCB. For example, the PCB unloading module may provide the PCB to a system for forming an overmold over components of the PCB, to a plasma cleaning system, or to a singulator. In some cases, the PCB unloading module 508 may load the PCB received from the marking module 506 into a magazine with other PCBs.

FIG. 5B illustrates an example flow 530 of a PCB 532 through the PCB imaging and marking system described in FIG. 5A. As illustrated in the PCB loading module 502, a PCB 532 is loaded by the loading module 502. Then the PCB imaging module 504 identifies X-Outs on the PCB 532 and maps the X-Outs into a map or data structure that includes the locations of the X-Outs or inked individual module substrates of the PCB. The PCB imaging module 504 can have one or more cameras. For example, as illustrated in FIG. 5B, the imaging module 504 may have two cameras, which can take images of two cookies substantially in parallel. The cameras and/or PCB can then move so that images of different cookies may be obtained. In other cases, the imaging module 504 may include more or less cameras, which can result in more or less images being captured of the PCB.

The marking module 506 receives the PCB 532 from the PCB imaging module 504, inverts the PCB so that the bottom is facing the laser, and marks the PCB 532 at locations corresponding to X-Outs on the top of the PCB 532 identified by the PCB imaging module 504. The locations for marking the PCB 532 may be included in a map created by the PCB imaging module 504, which is provided to the marking module 506. In other cases, the locations may be communicated to the marking module 506 by the PCB imaging module 504 without the creation of a map or data structure. The PCB unloading module 508 then provides access to the PCB 532 for providing to a user or subsequent subsystem in a fabrication system.

In some embodiments, one or more of the subsystems of the PCB imaging and marking system 500 can include a robotic system for conveying and positioning the PCB. For example, the PCB imaging module 504 can include a robotic system for positioning the PCB, or a portion of the PCB (e.g., a cookie) under the camera system 512 to facilitate the camera system capturing images of the PCB. As a second example, the marking module 506 can include a robotic system for positioning a side opposite to an inked side of a potentially defective individual module substrate to enable the marking module 506 to mark the side opposite to the inked side of the potentially defective individual module substrate. In some embodiments, the robotic system can include one or more robotic arms.

As previously stated, the camera system 512 may include one or more cameras. In cases where the camera system 512 includes a single camera, a robotic system, as described above, may be used to move the PCB such that the PCB, or portions of the PCB, are within the view of the camera. By moving the PCB so that the PCB, or portions thereof, are within the view of the camera, the camera system 512 can obtain images of the PCB, or portions thereof. A similar process may be used when the camera system 512 includes multiple cameras. For example, if the camera system 512 includes two cameras and the PCB includes four cookies, a robotic system can move the PCB so that two cookies are within the view of the camera's lens enabling images of two of the cookies to be obtained. The robotic system can then reposition the PCB so that images of the other two cookies can be obtained. Such initial positioning of the PCB to allow imaging of the first set of cookies, and repositioning of the PCB to allow imaging of the second set of cookies, can be facilitated by, for example, an index feeder and a stopper cooperating with a feeder mechanism to position and reposition the PCB in desired positions. Control of such components associated with the PCB movements can be effectuated or facilitated by a controller of the robotic system. In some embodiments, the robotic system is not included because, for example, the camera system 512 may include a sufficient number of cameras to obtain images of the PCB without repositioning the PCB. For example, suppose the PCB has four cookies and the camera system 512 includes two cameras. With such a configuration, it may be possible to obtain images of each of the cookies without a robotic system repositioning the PCB by, for example, each camera obtaining an image of two cookies within one image. In other cases, the camera system 512 may include as many cameras as the PCB has cookies. In such cases, each camera can take an image of one cookie and a robotic system may be unnecessary. In some embodiments, a robotic system may be included in the PCB imaging module 504 regardless of the number of cameras of the camera system 512 to facilitate positioning the PCB. In other embodiments, a robotic system is not included.

In some embodiments, the PCB imaging and marking system 500 may include additional subsystems, such as a singulator and/or a sorter. Alternatively, or in addition, the PCB imaging and marking system 500 may be in communication with other systems that, in some cases, may be used to perform a fabrication and/or packaging process.

Example of a PCB with X-Outs

Figure 6:
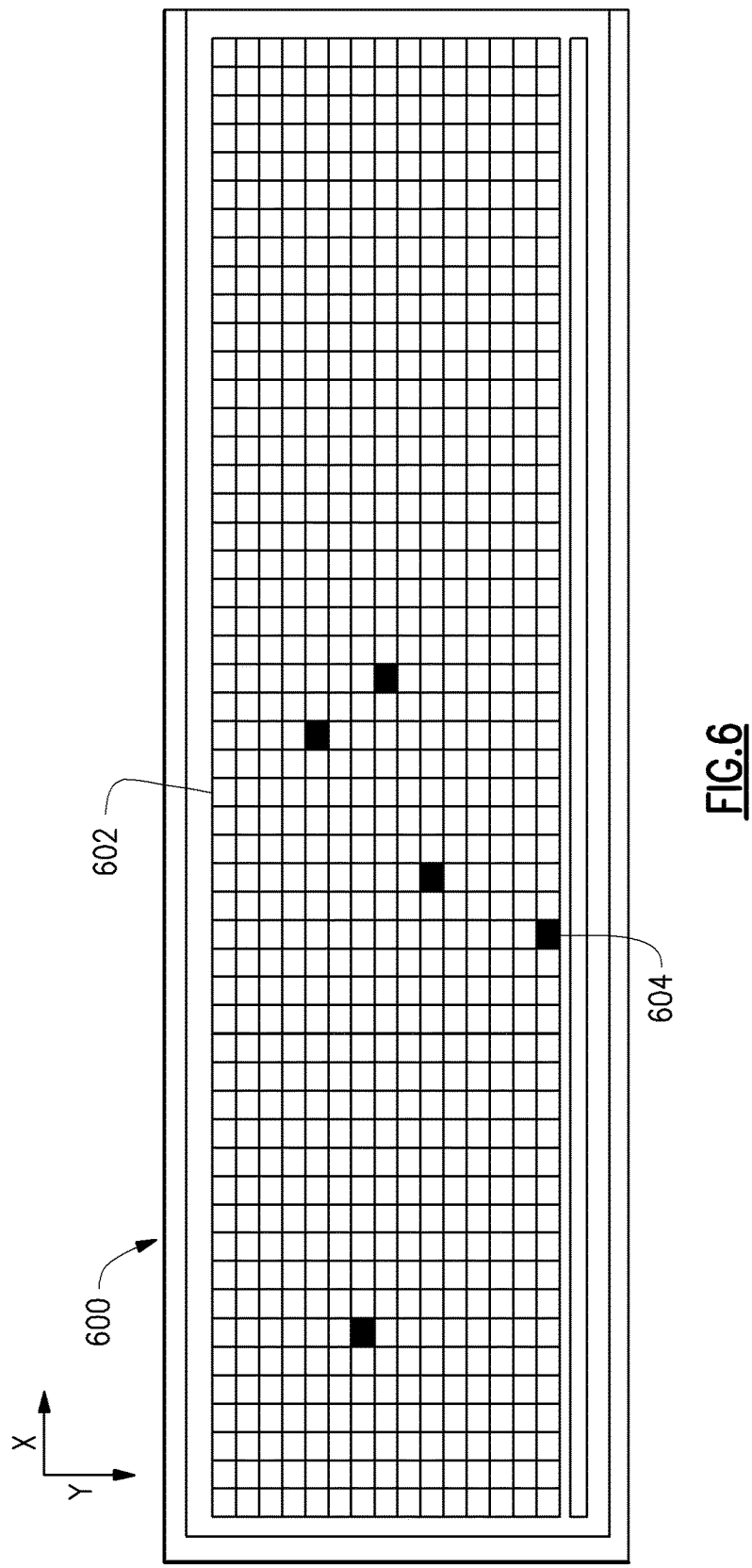
FIG. 6 illustrates an example of a PCB with several potentially defective individual module substrates.

FIG. 6 illustrates an example of a PCB 600 with several potentially defective individual module substrates. The PCB 600 includes a number of individual module substrates (e.g., individual module substrate 602). As illustrates by the darker shading, some of the individual modules substrates have been marked as potentially defective or as X-Outs (e.g., individual module substrate 604).

Example of a Map of a PCB

FIG. 7 illustrates one example of a representation of a map 700 identifying potentially defective individual module substrates. The map 700 can include a number of types of data is not limited in the data it includes or its format. Further, in some cases, the map 700 can include an image of a PCB for each entry in the map 700 in addition to or instead of the data entries presented in FIG. 7.

In the non-limiting example illustrated in FIG. 7, the map 700 includes a part identifier column 702, a PCB identifier column 704, an X-Out count column 706, and an X-Out mapping 708. The part identifier column 702 identifies the PCB type or model. In the example illustrated in FIG. 7, each of the PCBs identified in the map 700, or data structure, are of the same type. Although this is a common scenario with fabrication, it is possible in some cases for different types or models of PCBs to be used in a fabrication or manufacturing process. Thus, in some cases, the part identifier column 702 may include the identification of a number of PCB models.

The entry 710 is associated with the PCB 600 illustrated in FIG. 6. As illustrated in FIG. 7, the PCB 600, as well as the other PCBs included in the map 700 are of PCB type SKY65706-31.

The PCB identifier column 704 includes the identifier for the PCB that has been processed by the PCB imaging module 504. Generally, each PCB identifier is unique. However, in some embodiments, the PCB identifier may not be unique. For example, different PCB models may include an instance of the same PCB identifier. As a second example, a particular PCB may be processed more than once, which in some cases may result in multiple entries in the map 700. A PCB may be processed more than once to confirm the results obtained by the PCB imaging module 504 or to determine if a post imaging process, such as a cleaning process, causes the PCB imaging module 504 to generate a different mapping output. As illustrated in FIG. 7, for PCB identified in the entry 710 the PCB identifier is 62845011.

The X-Out count column 706 includes a count of the number of X-Outs or potentially defective individual module substrates included in the PCB. Thus, the PCB associated with the entry 710 includes five X-Outs or potentially defective individual module substrates.

The X-Out mapping column 708 identifies the location of each of the X-Outs on the PCB. The first two digits represent the X-coordinate, as illustrated in FIG. 6, of the location of the X-Out The second two digits represent the y-coordinate, as illustrated in FIG. 6, of the location of the X-Out. The count of the individual module substrates in both the x-direction and y-direction start with 0 in the examples depicted in FIGS. 6 and 7. Thus, the first individual module substrate is located at 0000. Therefore, the X-Out 604 illustrated in FIG. 6 is located at 2014, which is the second X-Out identified in the entry 710.

As previously stated, the map 700 can include an image of the PCB associated with each entry instead of or in addition to the X-Out mapping column 708 data for each entry. Thus, the entry 710 could include the image illustrated in FIG. 6 for the PCB 600 instead of or in addition to the data in the X-Out mapping column 708 for the entry 710.

Example of a PCB Identification Panel

Figure 8:
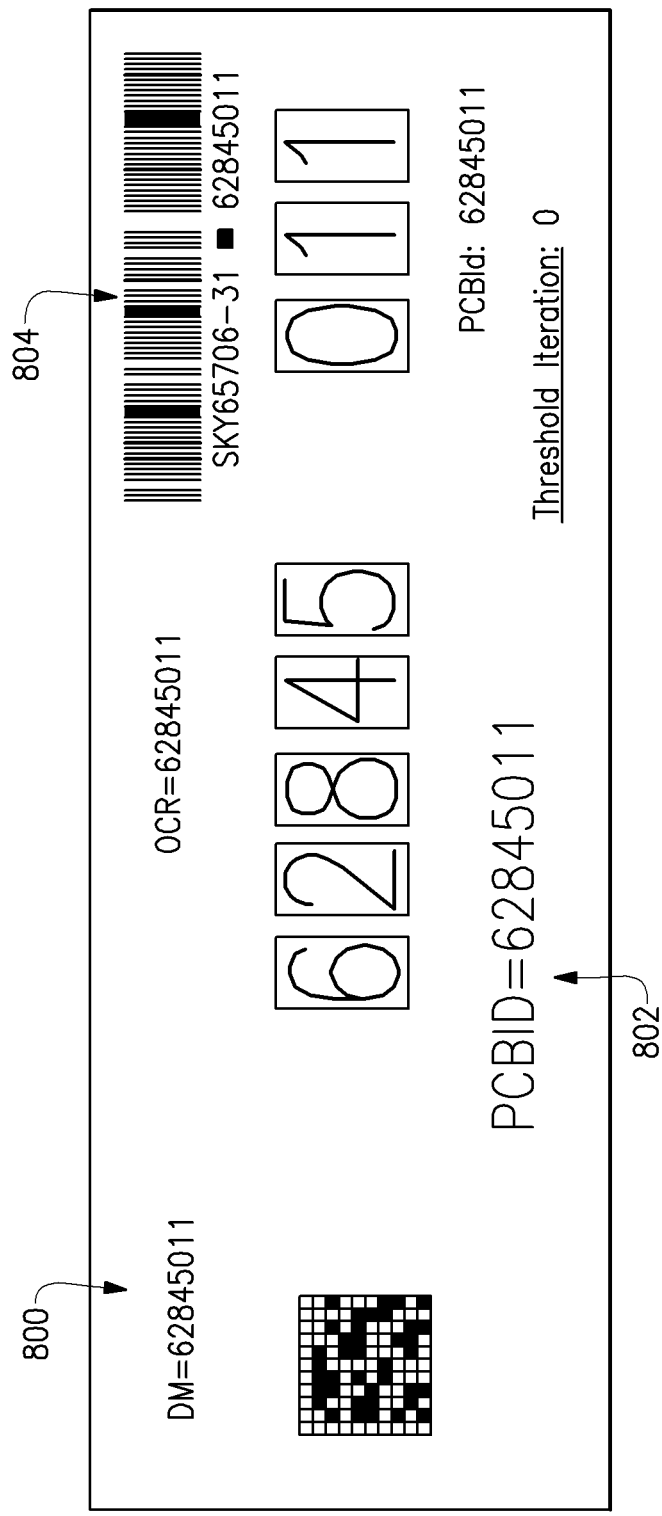
FIG. 8 illustrates one example of a PCB identification panel.

FIG. 8 illustrates one example of a PCB identification panel 800. The PCB identification panel 800 may be included as part of a PCB (e.g., the PCB 600). In some embodiments, the PCB identification panel may be optional and may not be included as part of a PCB. The PCB identification panel 800 can include a number of pieces of data that can be used to identify the PCB. For example, the PCB identification panel 800 can include a PCB identifier, which may be represented in a number of forms. For example, the PCB identifier may be displayed on the PCB identification panel 800 using alphanumeric characters as with the PCBID 802. As a second example, the PCB identifier may be included as a machine-readable code 804, such as a bar code or a QR code. This machine-readable code can be accessed by a scanner, such as an optical scanner, that may be included as part of the PCB identifier 514. In the example illustrated in FIG. 8, the PCB identifier corresponds to the PCB identifier of entry 710 in the PCB map 700.

Example of a Post-Mold Inking Process

Figure 9:
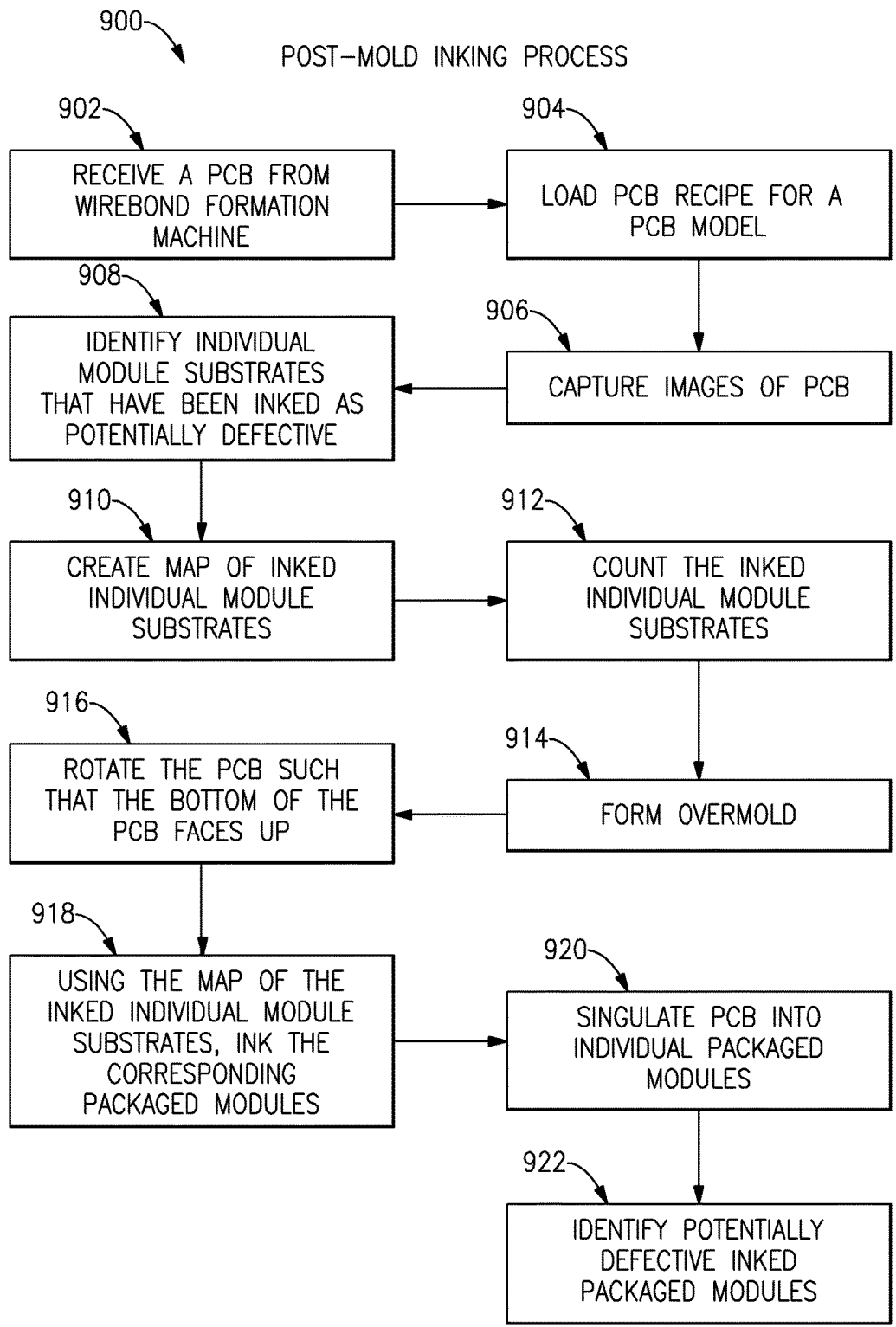
FIG. 9 presents a flowchart of an example of a post-mold inking process.

FIG. 9 presents a flowchart of an example of a post-mold inking process 900. The process 900 can be performed by one or more systems or subsystems configured to fabricate packaged modules, to identify potentially defective packaged modules, and to re-ink the potentially defective modules. For example, one or more of the systems identified in FIG. 5A, such as the PCB imaging module 504, may perform the process 900, either in whole or in part. Although a number of different systems and/or subsystems may perform operations associated with the process 900, the process 900 will be described with respect to particular example systems.

The process 900 may begin with, for example, the PCB loading module 502 receiving a PCB from, for example, a wirebond formation machine at block 902. It is possible for the PCB loading module 502 to receive the PCB from any type of machine that is capable of supplying a PCB to the PCB loading module 502 via a PCB transit system, such as a conveyor belt, tracks, or automated hand-off system. For example, the PCB could be received from a machine that adds devices or SMT component to a PCB. In some cases, the PCB loading module 502 may receive the PCB from a user that manually loads the PCB into the PCB loading module 502. Further, the PCB loading module 502 may provide the PCB to a PCB imaging module 504 as part of the block 902. Alternatively, the PCB loading module 502 may be included with the PCB imaging module 504.

At block 904, a PCB recipe loader 520 loads a PCB recipe for a PCB model. This PCB model is the model or type of PCB received at the block 902. In some cases, the PCB recipe is associated with a specific configuration of the PCB model. For example, the PCB recipe may be for the PCB model with a particular device and set of SMT components attached to each individual module substrate of the PCB. The PCB recipe loader 520 can load the PCB recipe from a repository of PCB recipes, such as the PCB recipe store 518. In some cases, the PCB recipe may be loaded by a user.

In some embodiments, the block 904 includes determining the PCB recipe to load based on the received PCB, such as by accessing a PCB identification panel (e.g., PCB identification panel 800). Determining the PCB recipe to load may be based on analyzing an image of the PCB, accessing a code or serial number on the PCB, or accessing a machine-readable code on the PCB.

An image capture device or system, such as the camera system 512, captures, or obtains, one or more images of the PCB at block 906. Capturing the images of the PCB can include obtaining pictures or images of one or more portions of the PCB. For example, a picture may be taken of each cookie of the PCB. Further, the images are typically of the top of the PCB or the side that includes any components attached to the PCB. However, is some cases, images may be taken of other sides of the PCB, such as the underside or bottom of the PCB. In some embodiments, the block 906 may also include performing one or more image processing operations on the pictures. For example, the image processor 510 may filter the captured images, perform touch up operations, or otherwise prepare the images for further processing by the PCB imaging module 504. In some embodiments, the block 906 may include accessing previously obtained images from a repository.

At block 908, the image processor 510 identifies individual module substrates that have been inked as potentially defective. The image processor 510 can identify the potentially defective individual module substrates by comparing the images captured at the block 906 with the PCB recipe loaded at the block 904. As, in certain cases, the PCB recipe will be a model or ideal version of the PCB, it will generally not include inkings or marks on the individual module substrates of the PCB recipe. Thus, comparing the captured images to the PCB recipe will enable the image processor 510 to identify locations of potentially defective modules by identifying individual module substrates that do not match those of the PCB recipe. In some cases, the PCB may have no potentially defective modules. In such cases, the process 900 may perform one or more of the blocks 912, 914, and 920 after the block 908, but may skip the remaining blocks of the process 900.

The potentially defective modules can include X-Outs that have been marked at some stage during a fabrication process prior to the PCB being received at the block 902. In some cases, the potentially defective modules may be functional, but may not meet desired specifications. For example, the potentially defective module may run slower or with lower gain than desired.

The individual module substrates that have been inked may be inked by a number of sources and/or for a number of reasons. For example, the inking may be performed manually by a user, may be triggered to be performed by a user, or may be performed automatically in response to an event. The inking may occur because a user or a system identified or caused an aberration in the fabrication process. For example, the user may have dropped the PCB, scraped it with a fingernail or against another part or machine, or noticed an aberration in the PCB. In some cases, a machine or system used during the fabrication process may detect an aberration in operation and as a result may cause a location on the PCB to be marked as potentially defective. For example, a system may detect an atypical, for the machine, vibration or shaking of the PCB during operation of the machine. Often, although not always, the ink or mark on the potentially defective module of the PCB will be on the top or on the side with the attached components of the PCB.

At block 910, the mapping module 516 creates a map (e.g., the map 700 or an entry therein) of the inked individual module substrates that were identified at the block 908. In some cases, the map may be stored at a repository, such as the PCB recipe store 518 or a map repository that may be part of the PCB imaging module 504 or may be part of a separate system that can communicate with the PCB imaging module 504.

The image processor 510, at block 912, counts the inked individual module substrates. By counting the inked individual module substrates, the PCB imaging module can help monitor yield of a particular model or brand of PCB, or of a particular fabrication process or machine used in the fabrication process. In some embodiments, one or both of the blocks 910 and 912 may be optional.

At block 914, an overmold may be created or formed over at least a portion of the PCB and, in some cases, the components attached to the PCB (e.g., dies, devices, and SMT components). Generally, although not necessarily, the process of creating the overmold over the PCB results in the ink markings on the potentially defective modules being covered or erased. In some embodiments, the overmold creation process of the block 914 can include one or more of the embodiments described above with respect to the block 121.

At block 916, the marking module 506 rotates the PCB such that the bottom of the PCB, or a side opposite to the side that includes the components attached to the PCB, faces up or faces the pen or inking tool of the marking module 506. In some embodiments, the block 916 is optional. For example, in some cases, the pen or inking tool may be positioned such that it is underneath the PCB as the PCB moves over through the marking module 506.

The marking module 506, using the map of the inked individual module substrates, inks locations on the bottom of the PCB that correspond to the inked or potentially defective individual module substrates at block 918. Inking the PCB may include positioning one or more of the PCB and the inking tool of the marking module 506 such that the inking tool is positioned over (or under) the individual substrate module to be marked. A singulator singulates, or cuts, the PCB into individual packaged modules at the block 920. In some embodiments, additional operations may be performed before or after the block 916 and/or 918. For example, a grinding process may occur after the molding process, but before the inking, or re-inking process of the block 916 and 918. In some embodiments, the block 920 can include some or all of the embodiments describe above with respect to the block 12p.

The singulator, a sorter, or other system may identify potentially defective inked packaged modules at the block 922 by identifying and/or separating the modules that were inked at the block 918 from the unmarked modules. In some cases, a user may perform the operation at the block 922.

Example of a Laser Marking Process

Figure 10:
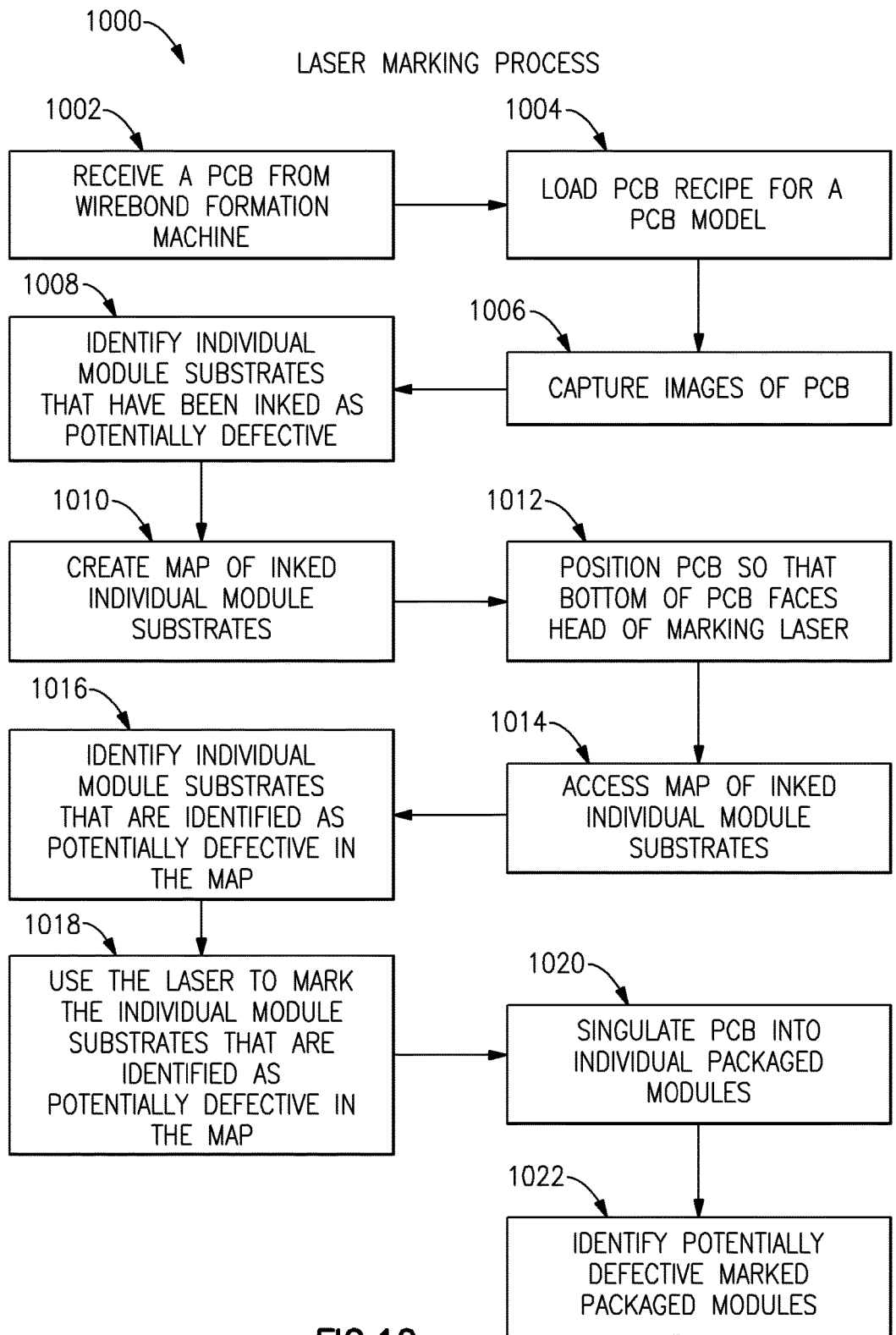
FIG. 10 presents a flowchart of an example of a laser marking process.

FIG. 10 presents a flowchart of an example of a laser marking process 1000. The process 1000 can be performed by one or more systems or subsystems configured to fabricate packaged modules, to identify potentially defective packaged modules, and to mark the potentially defective modules with a laser. For example, one or more of the systems identified in FIG. 5A, such as the PCB imaging module 504, may perform the process 1000, either in whole or in part. Although a number of different systems and/or subsystems may perform operations associated with the process 1000, the process 1000 will be described with respect to particular example systems.

The process 1000 may begin with, for example, the PCB loading module 502 receiving a PCB from, for example, a wirebond formation machine at block 1002. At block 1004, the PCB recipe loader 520 loads a PCB recipe for a PCB model of the PCB received at the block 1002. The camera system 512 captures one or more images of the received PCB at block 1006. At block 1008, the image processor 510 identifies individual modules substrates that have been inked as potentially defective. Then, the mapping module 516 creates a map of the inked individual module substrates at the block 1010. Although not illustrated in FIG. 10, in some embodiments, the process 1000 can include counting the inked individual module substrates. In some embodiments, one or more of the blocks 1002, 1004, 1006, 1008, and 1010 may include some or all of the embodiments described above with respect to the blocks 902, 904, 906, 908, and 910 respectively.

At block 1012, the PCB is positioned by, for example, the marking module 506 so that the side of the PCB opposite (e.g., the bottom or underside) to the side (e.g., the top) with attached dies, devices and/or components faces the head of a marking laser. The head of the marking laser generally refers to the component from which the laser beam exits the marking laser. The marking laser can include any type of laser that can cause a mark to be formed on an individual module substrate of the PCB without marking or causing damage to neighboring or other individual module substrates of the PCB. In some embodiments, the block 1012 is optional. For example, the laser may be positioned underneath the track upon which the PCB travels.

At block 1014, the marking module 506 accesses the map of the inked individual module substrates. Accessing the map may include accessing a repository (e.g., the PCB recipe store 518 or a map repository) that stores a copy of the map. Using the map, the marking module 506 can identify individual module substrates on the PCB that are identified as potentially defective in the map at block 1016.

After identifying the potentially defective modules, the marking module 506 can use the laser to mark the identified potentially defective individual module substrates at block 1018. Marking the individual module substrates can include marking locations on the bottom of the PCB that correspond to the potentially defective modules, which were identified based on ink markings on the top of the PCB.

As with the process 900, the process 1000 can include singulating the PCB into individual packaged modules at block 1020. A singulator, or other system, can then identify, and in some cases separate, potentially defective packaged modules based on the laser markings on the packaged modules. In some embodiments, the block 1020 can include some or all of the embodiments describe above with respect to the blocks 12p and/or 920. Further, in some embodiments, the blocks 1020 and 1022 may occur subsequent to additional fabrication operations, such as forming an overmold on the PCB or performing a cleansing process with respect to the PCB. In addition, in some cases, the block 1012 may occur subsequent to additional fabrication operations, such as the aforementioned molding or cleansing operations.

Example of an Imaging Process

Figure 11:
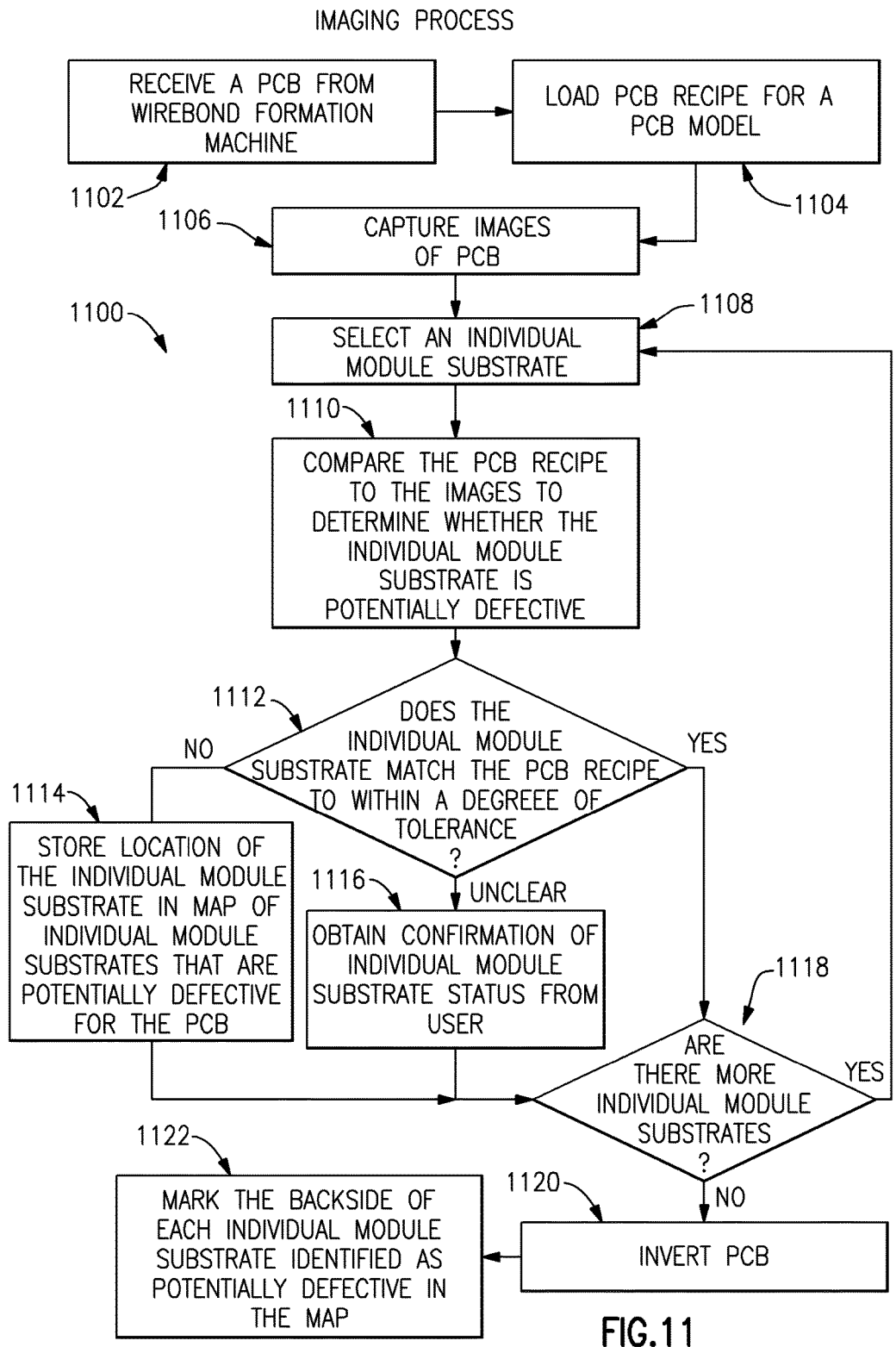
FIG. 11 presents a flowchart of an example of an imaging process.

FIG. 11 presents a flowchart of an example of an imaging process 1100. The process 1100 can be performed by one or more systems or subsystems configured to fabricate packaged modules, to identify the location of potentially defective packaged modules, and to store the location in a map. For example, one or more of the systems identified in FIG. 5A, such as the PCB imaging module 504, may perform the process 1100, either in whole or in part. Although a number of different systems and/or subsystems may perform operations associated with the process 1100, the process 1100 will be described with respect to particular example systems.

The process 1100 may begin with, for example, the PCB loading module 502 receiving a PCB from, for example, a wirebond formation machine at block 1102. At block 1104, the PCB recipe loader 520 loads a PCB recipe for a PCB model of the PCB received at the block 1102. The camera system 512 captures one or more images of the received PCB at block 1106. In some embodiments, one or more of the blocks 1102, 1104, and 1106 may include some or all of the embodiments described above with respect to the blocks 902, 904, and 906 respectively and/or with respect to the blocks 1002, 1004, and 1006 respectively.

At block 1108, the image processor 510 selects an individual module substrate of the PCB. Typically, the selected individual module substrate will be a module that has not been previously processed. However, in some cases, the image processor 510 may select a previously processed module. For example, a previously processed module may be re-selected based on a user command or if analysis of the module was inconclusive.

At block 1110, the image processor 510 compares the PCB recipe to one or more of the images captured, or obtained, at the block 1106 to determine whether the individual module substrate is potentially defective. Comparing the PCB recipe to the one or more images can include comparing an image of the selected individual module substrate, or a portion of the image that includes the selected individual module substrate, to a portion of the PCB recipe corresponding to the individual module substrate. Advantageously, in certain embodiments, by comparing the images of the individual module substrates to the PCB recipe, the image processor 510 can identify modules that have been marked as potentially defective, or as X-Outs. Further, in some embodiments, by comparing the images of the individual module substrates to the PCB recipe, the image processor 510 can identify potentially defective modules regardless of whether the module is marked or inked. For example, the image processor 510 may in some instances be able to identify missing devices or SMT components that should have been attached, misplaced devices or SMT components, missing or poorly formed wire bonds, etc.

The image processor 510, at determination block 1112, determines whether the individual module substrate (or its image) matches the PCB recipe (or a corresponding portion thereof) to within a degree of tolerance. In some cases, this degree of tolerance may be due to limitations in the hardware and/or software used to perform the comparison. In other cases, the degree of tolerance may be user specified. Further, the degree of tolerance may be specific to the image processor 510 and/or the PCB. Moreover, the degree of tolerance may be pre-specified, application specific, or may be specified by a user. The degree of tolerance may be based on any measure that can be used to determine the accuracy or closeness of a match between the image of the individual module substrate and the corresponding portion of the PCB recipe. For instance, the degree of tolerance may be based on a percentile match between a mathematical representation of the image of the individual module substrate and the corresponding portion of the PCB recipe. In some cases, the image processor 510 may determine a match without a permissible degree of tolerance. As indicated above, determining whether the individual module substrate matches the PCB recipe includes determining whether the individual module substrate is marked or is potentially defective.

If the image processor 510 determines that the individual module substrate does not match the PCB recipe within a degree of tolerance, the mapping module 516, at block 1114, stores the location of the individual module substrate in a map of individual modules substrates that are potentially defective for the PCB received at the block 1102. The map can use any system for identifying the location of the individual module substrate on the PCB. For example, storing the location of the individual module substrate in the map can include Storing the location of the individual module substrate in the map can include storing coordinates for the module using an XY coordinate system mapped to the PCB, such as illustrated with respect to the map 700 in FIG. 7. As a second example, storing the location of the individual module substrate can include specifying a numeric value associated with the module where each numeric value is associated with a specific module when the PCB is oriented in a particular direction. For instance, module 1 can be the top-left module when the PCB is oriented in a particular direction, module 2 can be the module immediately to the right of module 1, etc.

If the image processor 510 is unable to determine within the degree of tolerance whether the individual module substrate matches the PCB recipe, the PCB imaging module 504 can obtain confirmation of whether the individual module substrate is potentially defective from a user at block 1116. In some embodiments, the block 1116 is optional. In such embodiments, if the image processor 510 cannot determine whether the individual module substrate matches the PCB recipe within the degree of tolerance, the individual module substrate may be treated the same as if the image processor determines that the individual module substrate does not match the PCB recipe within the degree of tolerance.

If the image processor 510 determines that the individual module substrate matches the PCB recipe within a degree of tolerance, and therefore is likely not a potentially defective module, or the blocks 1114 or 1116 have completed being processed, the image processor determines whether more individual modules substrates exist on the PCB at the decision block 1118. If so, the process 1100 returns to the block 1108 where another individual module substrate is selected.

If no unprocessed individual module substrates exist, the marking module 506 inverts the PCB at block 1120 such that the PCB faces the head of a marking mechanism, such as an inking tool, a laser, or other marking mechanism capable of marking a PCB. In some embodiments, the block 1120 is optional. At block 1122, the marking module 506 marks the backside, or the side without attached components, of each individual module substrate identified as potentially defective in the map of the PCB. In some embodiments, the block 1122 is optional.

In some embodiments, the process 1100 involves analyzing each individual module substrate one at a time, or in some cases a subset at a time, to determine if the individual module substrate, or a subset of module substrates, is defective. However, in some alternative embodiments, the process 1100 compares one or more images of the PCB to the PCB recipe and identifies locations or regions in the images that do not match the PCB recipe within a degree of tolerance. After identifying the regions in the image of the PCB with discrepancies, the image processor 510 can select individual module substrates located in the region at the block 1108 and perform the process 1100 with respect to these selected individual module substrates. Advantageously, in certain embodiments, by focusing on the individual module substrates located in regions with identified discrepancies while not selecting individual module substrates outside of these regions, the process 1100 can be performed more quickly compared to embodiments where every individual module substrate is examined via the process 1100.

Example of an Individual Substrate Module Separation Process

Figure 12:
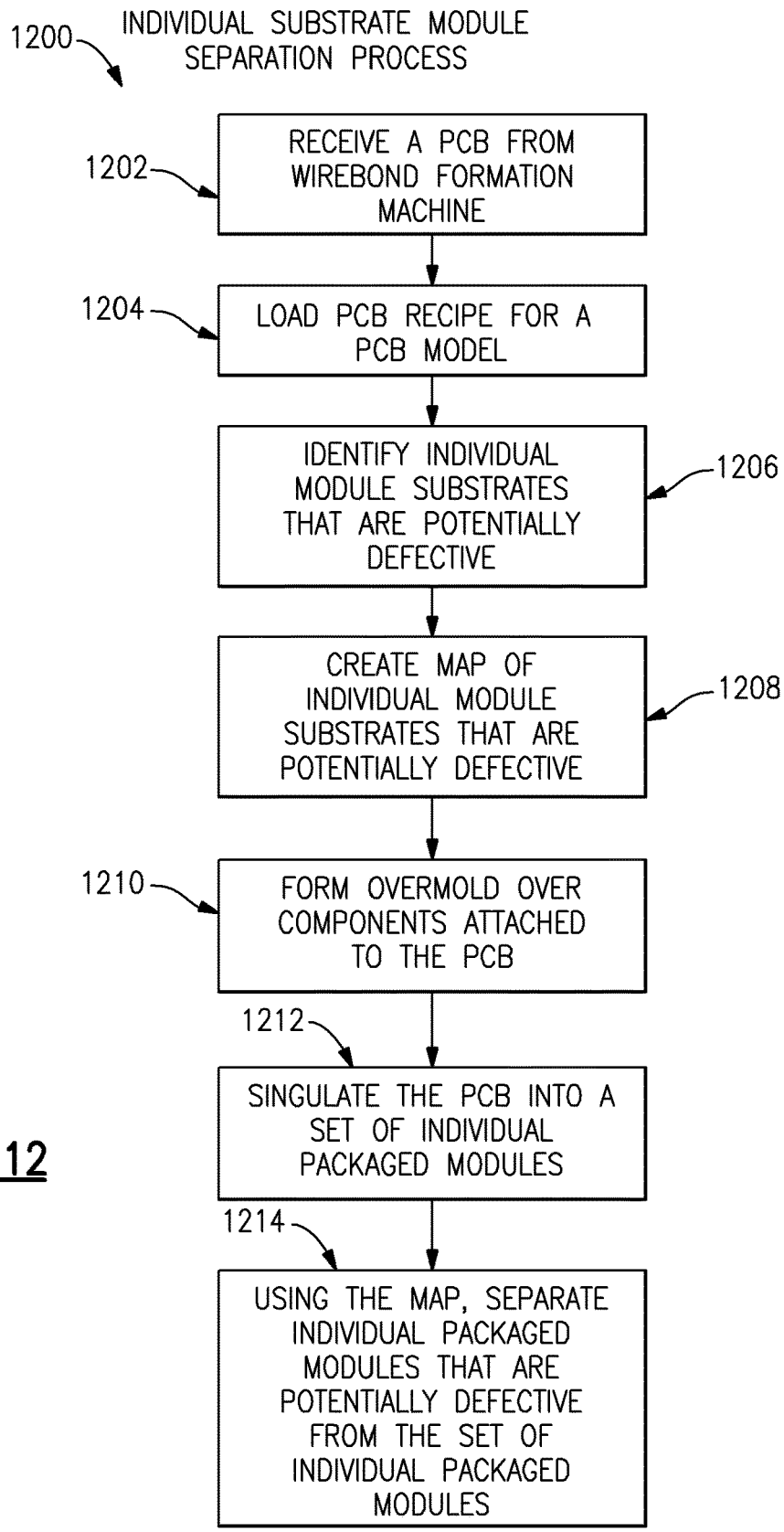
FIG. 12 presents a flowchart of an example of an individual substrate module separation process.

FIG. 12 presents a flowchart of an example of an individual substrate module separation process 1200. The process 1200 can be performed by one or more systems or subsystems configured to fabricate packaged modules, to identify potentially defective packaged modules, to separate the individual packaged modules of the PCB, and to sort the individual packaged modules based on whether the individual packaged modules are potentially defective. For example, one or more of the systems identified in FIG. 5A, such as the PCB imaging module 504, may perform the process 1200, either in whole or in part. Although a number of different systems and/or subsystems may perform operations associated with the process 1200, the process 1200 will be described with respect to particular example systems.

The process 1200 may begin with, for example, the PCB loading module 502 receiving a PCB from, for example, a wirebond formation machine at block 1202. At block 1204, the PCB recipe loader 520 loads a PCB recipe for a PCB model of the PCB received at the block 1202. In some embodiments, one or more of the blocks 1202 and 1204 may include some or all of the embodiments described above with respect to the blocks 902 and 904 respectively, the blocks 1002 and 1004 respectively, and/or the blocks 1102 and 1104 respectively.

At the block 1206, the image processor 510 identifies individual module substrates that are potentially defective. The image processor 510 can use any process or operation for identifying the potentially defective individual module substrates. For example, the image processor 510 can compare one or more images of the PCB to the PCB recipe to identify inked individual module substrates using, for example, the operations described with respect to one or more of the blocks 906, 908, 1006, 1008, 1106, 1108, and 1110. As a second example, the image processor 510 can scan the PCB to identify locations that have been inked, or otherwise marked, based on an identifying characteristic of the marking or marking substance. For instance, if the marking substance reflects a different wavelength or set of wavelengths of light, the image processor 510 may identify potentially defective individual module substrate based on the reflected light detected by the camera system 512. As a third example, the image processor 510 can compare the images of the PCB to the PCB recipe to identify discrepancies, such as markings, scratches, missing dies and/or SMT components, misplaced dies or and/or SMT components, or any other type of discrepancy or flaw in the PCB that can be identified by comparing the images to the PCB recipe.

The mapping module 516 creates a map of the individual module substrates that are potentially defective at block 1208. In some embodiments, the block 1208 can include one or more embodiments described above with respect to the blocks 910, 1010, and/or 1114.

At block 1210, an overmold is formed over components attached to the PCB. In some embodiments, the block 1210 can include some or all of the embodiments described above with respect to the blocks 121 and/or 914.

A singulator singulates the PCB into a set of individual packaged modules at the block 1212. In some embodiments, the block 1212 can include some or all of the embodiments described above with respect to the blocks 12p, 920, and/or 1020.

Using the map created at the block 1208, the singulator or a sorter may separate individual packaged modules that are potentially defective from the set of individual packaged modules at block 1214. Separating the potentially defective individual packaged modules can include identifying, based on information stored in the map, the individual packaged modules that are potentially defective. In some embodiments, the block 1208 can include some or all of the embodiments described above with respect to the blocks 922 and/or 1022.

ADDITIONAL EMBODIMENTS

Although a number of processes have been described for identifying and/or sorting potentially defective modules of a PCB, the processes are not limited as such. In some embodiments, at least some of the aforementioned processes may be used for identifying and/or sorting modules of a PCB based for purposes alternative to potential defects. For instance, in some cases, one or more of the aforementioned processes may be used to separate modules on a PCB that have alternative, but potentially non-defective, configurations. In some cases, modules of a PCB that do not meet a particular specification may be separated from modules that do meet the specification and used for systems that do have lower specification requirements.

Further, in some cases, a PCB may include modules with different configurations. For instance, a fabrication process may be configured to produce multiple individual packaged module designs on a single PCB. In such cases, the aforementioned processes may be used to separate and sort the different types of individual packaged modules.

Terminology

Many other variations than those described herein will be apparent from this disclosure. For example, depending on the embodiment, certain acts, events, or functions of any of the algorithms described herein can be performed in a different sequence, can be added, merged, or left out all together (e.g., not all described acts or events are necessary for the practice of the algorithms). For instance, in some cases, the block 912 may not occur in the process 900. As a second example, the operations associated with the block 1004 may occur prior to the operations associated with the block 1002. In other cases, the process 1000 may include the operations associated with the block 912. Moreover, in certain embodiments, acts or events can be performed concurrently, e.g., through multi-threaded processing, interrupt processing, or multiple processors or processor cores or on other parallel architectures, rather than sequentially. For instance, the operations associated with the block 1020 and 1022 may occur in parallel or may be intertwined. In addition, different tasks or processes can be performed by different machines and/or computing systems that can function together.

The various illustrative logical blocks, modules, and algorithm steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, any of the signal processing algorithms described herein may be implemented in analog circuitry. A computing environment can include any type of computer system, including, but not limited to, a computer system based on a microprocessor, a mainframe computer, a digital signal processor, a portable computing device, a personal organizer, a device controller, and a computational engine within an appliance, to name a few.

The steps of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of non-transitory computer-readable storage medium, media, or physical computer storage known in the art. An example storage medium can be coupled to the processor such that the processor can read information from, and write information to, the storage medium. In the alternative, the storage medium can be integral to the processor. The processor and the storage medium can reside in an ASIC. The ASIC can reside in a user terminal. In the alternative, the processor and the storage medium can reside as discrete components in a user terminal. In addition, certain steps of a method, process, or algorithm described in connection with the embodiments disclosed herein can be performed by one or more mechanical systems that may be controlled by hardware, software, or a combination of the two. For instance, the marking module 506 may include mechanical devices for moving a PCB from an ingress point to an egress point and for positioning the PCB under the head of a marking tool. These actions may be controlled by an embedded processor or a computing system that controls the marking module 506.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Further, the term "each," as used herein, in addition to having its ordinary meaning, can mean any subset of a set of elements to which the term "each" is applied.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments of the inventions described herein can be embodied within a form that does not provide all of the features and benefits set forth herein, as some features can be used or practiced separately from others.

What is claimed is:

1. A method of identifying potentially defective individual packaged modules, the method comprising:
   receiving a Printed Circuit Board (PCB) including a set of individual module substrates;
   capturing an image of a first side of the PCB;
   loading a PCB recipe associated with the PCB;
   for each individual module substrate of the set of individual module substrates, comparing a portion of the image of the first side of the PCB corresponding to the individual module substrate to the PCB recipe, determining based on the comparison whether the individual module substrate matches the PCB recipe within a degree of tolerance, and in response to determining that the individual module substrate does not match the PCB recipe within the degree of tolerance, storing a location of the individual module substrate within a map of the PCB; and
   counting all stored locations in the map for the set of individual module substrates to enable tracking of PCB yield.

2. The method of claim 1 further comprising, for each individual module substrate of the set of individual module substrates, creating a marking at a location on a second side of the PCB corresponding to the individual module substrate, the second side opposite to the first side of the PCB.

3. The method of claim 2 wherein creating a marking includes rotating the PCB so that a second face of the PCB faces an inking tool.

4. The method of claim 1 wherein the map identifies individual module substrates of the PCB that are potentially defective.

5. The method of claim 1 wherein capturing the image of the first side of the PCB includes capturing multiple images of the first side of the PCB, each image corresponding to a different portion of the first side of the PCB.

6. The method of claim 1 further comprising identifying a PCB model of the PCB.

7. The method of claim 5 wherein identifying the PCB model includes receiving the identity of the PCB model from a user.

8. The method of claim 5 wherein identifying the PCB model includes determining the PCB model based on the image of the PCB.

9. The method of claim 5 wherein identifying the PCB model includes scanning a machine-readable code on the PCB and identifying the PCB model based on information encoded in the machine-readable code.

10. The method of claim 5 wherein the PCB recipe corresponds to the PCB model.

11. A system for identifying potentially defective individual packaged modules, the system comprising:
    a Printed Circuit Board (PCB) loader configured to load a PCB, the PCB including a set of individual module substrates;
    an image capture module configured to capture an image of a first side of the PCB;
    a PCB recipe loader configured to load a PCB recipe corresponding to the PCB;
    an image processor configured, for each individual module substrate of the set of individual module substrates, to compare a portion of the image of the first side of the PCB corresponding to the individual module substrate to the PCB recipe, and to determine based on the comparison whether the individual module substrate matches the PCB recipe within a degree of tolerance; and
    a mapping module configured to store a location of the individual module substrate within a map of the PCB in response to the image processor determining that the individual module substrate does not match the PCB recipe within the degree of tolerance and configured to count all stored locations in the map for the set of individual module substrates to enable tracking of PCB yield.

12. The system of claim 11 wherein the map identifies individual module substrates of the PCB that are potentially defective.

13. The system of claim 11 further comprising a marking module configured, for each individual module substrate of the set of individual module substrates, to create a marking at a location on a second side of the PCB, the location corresponding to the individual module substrate.

14. The system of claim 11 wherein the image capture module is further configured to capture multiple images of the first side of the PCB, each image corresponding to a different portion of the first side of the PCB.

15. The system of claim 11 further comprising a PCB identifier configured to identify a PCB model of the PCB.

16. The system of claim 15 wherein the PCB identifier is configured to identify the PCB model based on the image of the PCB.

17. The system of claim 16 wherein the PCB identifier is configured to scan a machine-readable code on the PCB and to identify the PCB model based on information encoded in the machine-readable code.

18. A system for identifying potentially defective individual packaged modules, the system comprising:
- a Printed Circuit Board (PCB) loader configured to load a PCB, the PCB including a set of individual module substrates;
- an image capture module configured to capture an image of a first face of the PCB;
- a processor configured to identify, using the image of the first face of the PCB, potentially defective individual module substrates of the PCB based on a first set of markings included on the potentially defective individual module substrates, and to count the first set of markings thereby enabling tracking of PCB yield;
- a mapping module configured to create a map of the marked individual module substrates based on the first set of markings; and
- an overmold module configured to form an overmold over at least a portion of the first face of the PCB, the overmold covering the first set of markings.

19. The system of claim 18 wherein the system further comprises a marking module configured to mark locations on the PCB corresponding to potentially defective individual module substrates to create a second set of markings, the locations identified via the map.

20. The system of claim 18 further comprising a PCB recipe loader configured to load a PCB recipe corresponding to a PCB model of the PCB.

* * * * *